(12) United States Patent
Iguchi et al.

(10) Patent No.: US 11,398,464 B2
(45) Date of Patent: Jul. 26, 2022

(54) MICRO LIGHT EMITTING ELEMENT AND IMAGE DISPLAY DEVICE

(71) Applicant: Sharp Fukuyama Laser Co., Ltd., Fukuyama (JP)

(72) Inventors: Katsuji Iguchi, Fukuyama (JP); Hidenori Kawanishi, Fukuyama (JP)

(73) Assignee: Sharp Fukuyama Laser Co., Ltd., Fukuyama (JP)

( * ) Notice: Subject to any disclaimer, the term of this patent is extended or adjusted under 35 U.S.C. 154(b) by 13 days.

(21) Appl. No.: 16/928,497

(22) Filed: Jul. 14, 2020

(65) Prior Publication Data

US 2021/0020619 A1 Jan. 21, 2021

(30) Foreign Application Priority Data

Jul. 17, 2019 (JP) .............................. JP2019-132062

(51) Int. Cl.
*H01L 33/20* (2010.01)
*H01L 33/40* (2010.01)
*H01L 33/38* (2010.01)
*H01L 33/60* (2010.01)
*H01L 33/44* (2010.01)
*H01L 33/50* (2010.01)
*H01L 33/32* (2010.01)
*H01L 25/16* (2006.01)
*H01L 33/00* (2010.01)

(52) U.S. Cl.
CPC ............ *H01L 25/167* (2013.01); *H01L 33/20* (2013.01); *H01L 33/385* (2013.01); *H01L 33/405* (2013.01); *H01L 33/60* (2013.01); *H01L 33/0093* (2020.05); *H01L 33/32* (2013.01); *H01L 33/44* (2013.01); *H01L 33/505* (2013.01); *H01L 2933/0016* (2013.01); *H01L 2933/0025* (2013.01)

(58) Field of Classification Search
CPC ..... H01L 33/20; H01L 33/385; H01L 33/405; H01L 33/60; H01L 33/0093; H01L 33/32; H01L 33/44; H01L 33/505; H01L 25/167; H01L 2933/0016; H01L 2933/0025
See application file for complete search history.

(56) References Cited

U.S. PATENT DOCUMENTS

2015/0008392 A1* 1/2015 Bonar ..................... H01L 33/32
438/47
2018/0062047 A1* 3/2018 Biwa ...................... H01L 33/46
(Continued)

FOREIGN PATENT DOCUMENTS

JP 2002-141492 A 5/2002

*Primary Examiner* — Mark W Tornow
(74) *Attorney, Agent, or Firm* — ScienBiziP, P.C.

(57) ABSTRACT

A micro light emitting element includes: a body including a compound semiconductor layer in which a first conductive layer, a light emission layer, and a second conductive layer with a conductive type opposite to a conductive type of the first conductive layer are stacked in order from a light emitting surface side; a first electrode including a transparent electrode on the light emitting surface side; a second electrode including a metal film on a side opposite to the light emitting surface side; and a first reflective material covering a side surface of the body. The light emission layer is disposed on the light emitting surface side of the body. The side surface of the body is tapered at an inclination angle to open in a light emitting direction.

20 Claims, 29 Drawing Sheets

(56) References Cited

U.S. PATENT DOCUMENTS

| | | | | |
|---|---|---|---|---|
| 2019/0088633 A1* | 3/2019 | Tao | .................... | H01L 21/3212 |
| 2020/0035748 A1* | 1/2020 | Xia | ........................ | H01L 33/32 |
| 2020/0343421 A1* | 10/2020 | Su | .......................... | H01L 33/58 |
| 2020/0350473 A1* | 11/2020 | Hsu | ........................ | H01L 33/58 |

\* cited by examiner

FIG.10
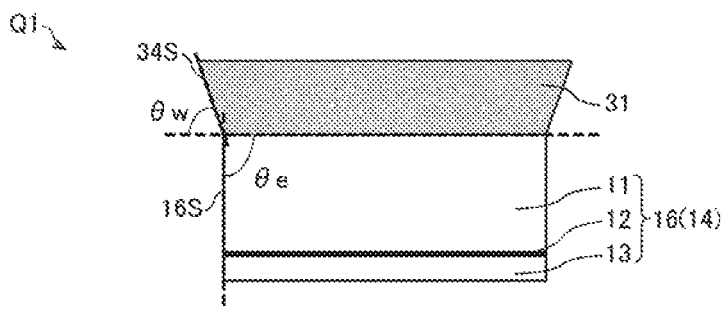
| ITEM | THICKNESS (nm) | INCLINATION ANGLE (DEGREE) |
|---|---|---|
| P-SIDE LAYER | 200 | 90 |
| N-SIDE LAYER : θe | 3000 | 90 |
| TRANSPARENT PORTION : θw | 2500 | 70 |
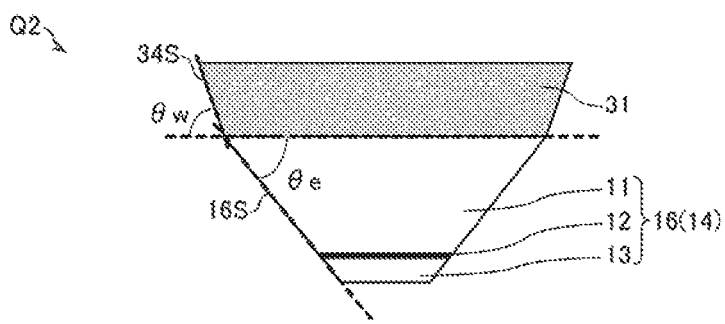
| ITEM | THICKNESS (nm) | INCLINATION ANGLE (DEGREE) |
|---|---|---|
| P-SIDE LAYER | 200 | 90 |
| N-SIDE LAYER : θe | 3000 | 45 |
| TRANSPARENT PORTION : θw | 2500 | 70 |
11 : N-SIDE LAYER
12 : LIGHT EMISSION LAYER
13 : P-SIDE LAYER
16 (14) : BODY (COMPOUND SEMICONDUCTOR LAYER)
16S : SIDE SURFACE
31 : TRANSPARENT PORTION
34S : PARTITION SIDE SURFACE

| ITEM | THICKNESS (nm) | INCLINATION ANGLE (DEGREE) |
|---|---|---|
| P-SIDE LAYER | 200 | 70 |
| N-SIDE LAYER | 3000 | — |
| $\theta e2$ | 2000 | 70 |
| $\theta e1$ | 1000 | 45 |
| $\theta w$ | 2500 | 70 |

```
11: N-SIDE LAYER
12: LIGHT EMISSION LAYER
13: P-SIDE LAYER
16a (14): BODY (COMPOUND
SEMICONDUCTOR LAYER)
16Sa: SIDE SURFACE
16Sa1: FIRST SIDE SURFACE
16Sa2: SECOND SIDE SURFACE
31: TRANSPARENT PORTION
34S: PARTITION SIDE SURFACE
```

| ITEM | THICKNESS (nm) | INCLINATION ANGLE (DEGREE) |
|---|---|---|
| P-SIDE LAYER | 200 | 45 |
| N-SIDE LAYER | 3000 | — |
| $\theta e11$ | 1000 | 45 |
| $\theta e12$ | 2000 | 70 |
| $\theta w$ | 2500 | 70 |

11: N-SIDE LAYER
12: LIGHT EMISSION LAYER
13: P-SIDE LAYER
16b (14): BODY (COMPOUND SEMICONDUCTOR LAYER)
16Sb: SIDE SURFACE
16Sb11: FIRST SIDE SURFACE
16Sb12: SECOND SIDE SURFACE
31: TRANSPARENT PORTION
34S: PARTITION SIDE SURFACE

FIG.24
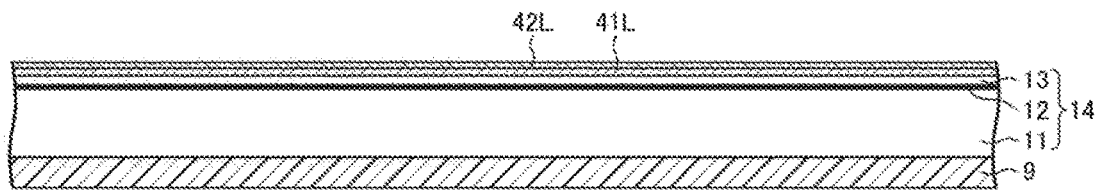
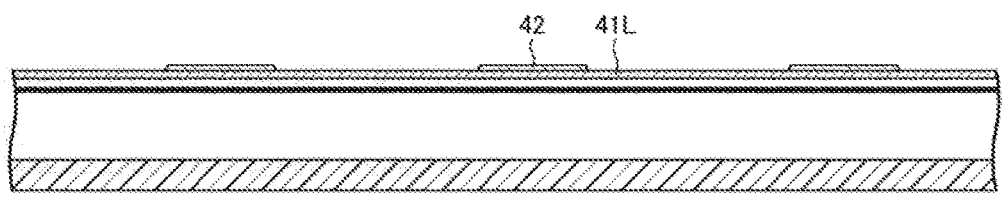
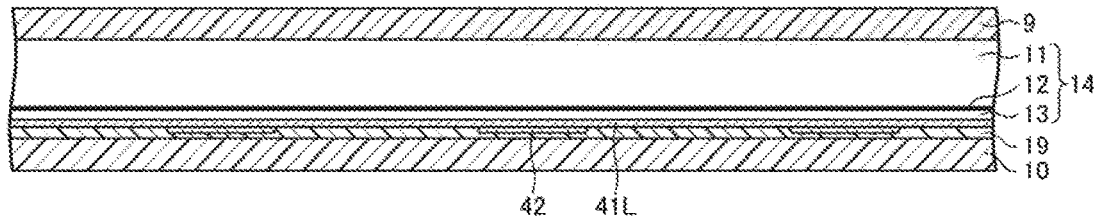
9: GROWTH SUBSTRATE
10: LED PROCESSING SUBSTRATE
11: N-SIDE LAYER
12: LIGHT EMISSION LAYER
13: P-SIDE LAYER
14: COMPOUND SEMICONDUCTOR LAYER
19: ADHESIVE LAYER
41: TRANSPARENT ELECTRODE
41L: TRANSPARENT ELECTRODE LAYER
42: P-ELECTRODE CONNECTION PORTION
42L: METAL ELECTRODE LAYER

FIG.25
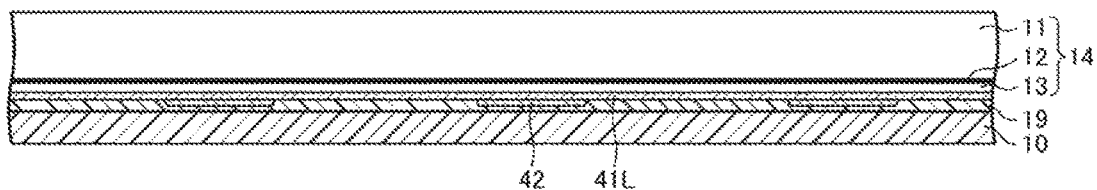
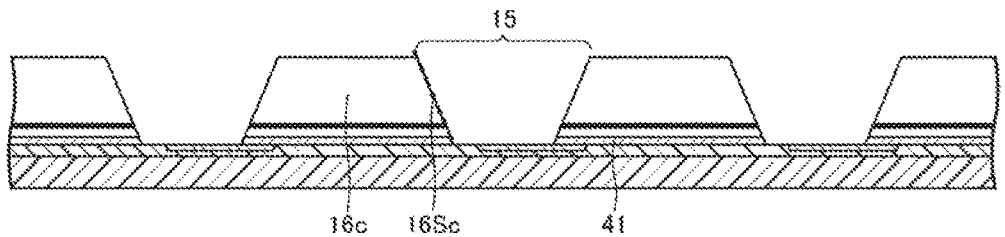
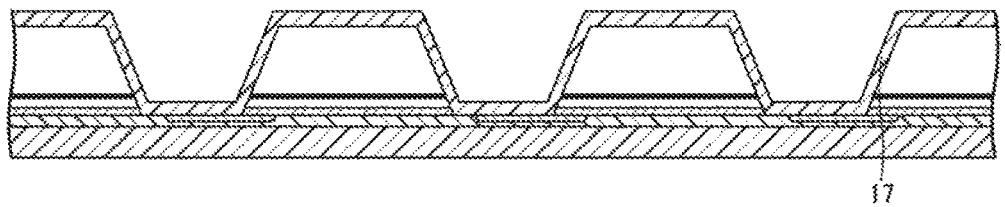

MICRO LIGHT EMITTING ELEMENT AND IMAGE DISPLAY DEVICE

CROSS REFERENCE TO RELATED APPLICATION

The present application claims priority from Japanese Patent Application No. 2019-132062, filed Jul. 17, 2019, the entire contents of which are hereby incorporated by reference into this application.

BACKGROUND OF THE INVENTION

1. Field of the Invention

The present disclosure relates to a micro light emitting element and an image display device including a micro light emitting element.

2. Description of the Related Art

In the related art, there is proposed a display element in which a plurality of micro light emitting elements constituting pixels are disposed on a driving circuit substrate. For example, in a technique disclosed in Japanese Patent Application Publication No. 2002-141492, a driving circuit is formed on a silicon substrate and a minute light emitting diode (LED) array that emits ultraviolet light is disposed on the driving circuit. The above technique discloses a small display element in which a wavelength conversion layer for converting the ultraviolet light into visible light of red, green, and blue is provided on the light emitting diode array to display a color image.

Such a display element is small, but has high luminance and high durability. Thus, such a display element is expected as a display element for display devices such as glasses-like devices and head-up displays (HUDs).

As a manufacturing method of such a display element, a method is generally employed in which the driving circuit substrate and the micro light emitting element are formed separately and then bonded together since a material of the substrate and a material of the element are different.

However, there are the following problems in structures of the micro light emitting element and the display element disclosed in the above-mentioned Japanese Patent Application Publication No. 2002-141492. First, a large ratio (tens of percent) of light generated in a light emission layer of a certain micro light emitting element is emitted from a side surface of the micro light emitting element toward a micro light emitting element adjacent to the micro light emitting element. Such light is absorbed by the adjacent micro light emitting element and is emitted again from the adjacent micro light emitting element that absorbs the light. Therefore, optical crosstalk occurs in which a micro light emitting element other than a micro light emitting element originally requested to emit light appears to emit light.

In a case where the micro light emitting elements are connected by a compound semiconductor, light leaks to an adjacent micro light emitting element through the compound semiconductor, and thus the same optical crosstalk occurs. Such optical crosstalk causes problems such as a decrease in contrast and a decrease in color purity.

In the technique disclosed in Japanese Patent Application Publication No. 2002-141492, a large amount of light is lost due to the light emission from the side surface of the micro light emitting element, and the light generated in the light emission layer of the micro light emitting element is trapped inside the micro light emitting element. This is because the compound semiconductor constituting the micro light emitting element has a larger refractive index than air and resin and thus total reflection occurs in a range of wide incident angle when light is incident on an interface between the compound semiconductor and the outside of the compound semiconductor. Due to the causes, the light extraction efficiency of the micro light emitting element becomes low and thus the light emission efficiency becomes low. The light extraction efficiency indicates a ratio of the light emitted to the outside of the micro light emitting element to the light generated inside the micro light emitting element, and the light emission efficiency indicates the efficiency in which a current or power applied to the micro light emitting element is converted as light emitted to the outside of the display element. The decrease in light emission efficiency causes problems such as an increase in power consumption and an increase in temperature due to heat generation.

One aspect of the present disclosure is made in view of the above problems, and it is desirable to prevent optical crosstalk between adjacent micro light emitting elements and to improve light emission efficiency of the micro light emitting element.

SUMMARY OF THE INVENTION

According to an aspect of the disclosure, there is provided a micro light emitting element including a body including a compound semiconductor layer in which a first conductive layer, a light emission layer, and a second conductive layer having a conductive type opposite to that of the first conductive layer are stacked in order from a light emitting surface side, a first electrode including a transparent electrode on the light emitting surface side, a second electrode including a metal film on a side opposite to the light emitting surface side, and a first reflective material covering a side surface of the body. The light emission layer is disposed on the light emitting surface side of the body. The side surface of the body is tapered to open in a light emitting direction. A surface of the second electrode and a surface of the first reflective material on the body side are each a reflective surface that reflects visible light.

Figure 9:
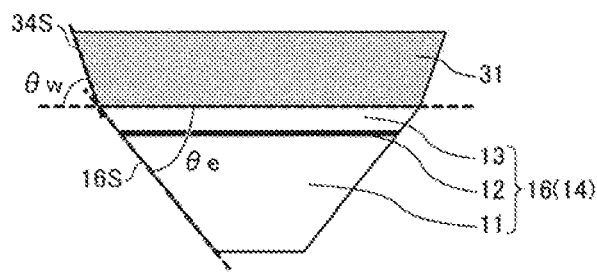
FIG. 9 is a schematic cross-sectional view of a simulated structure (reverse truncated pyramid type structure) imitating the first embodiment of the present disclosure.
Figure 11:
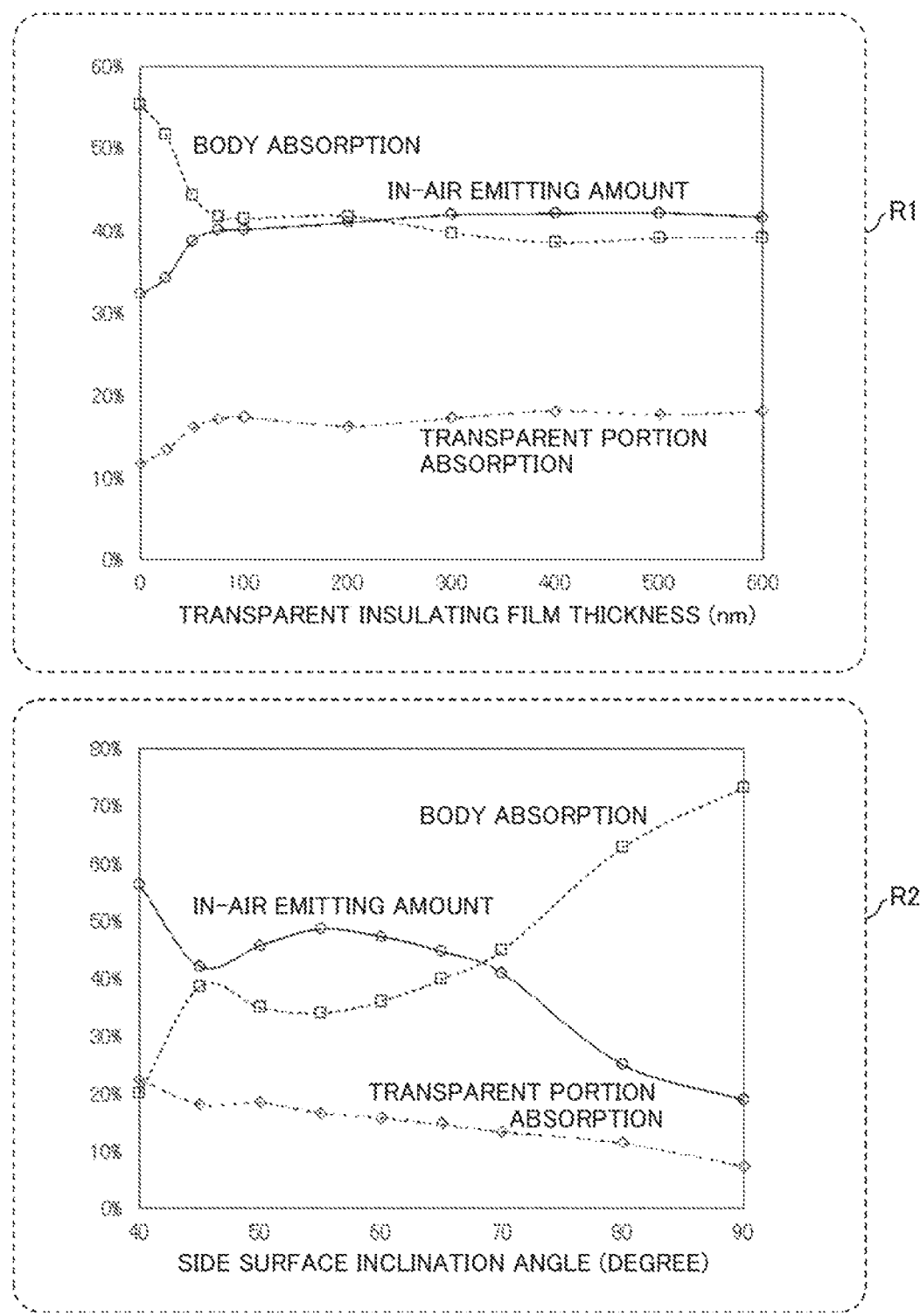
Figure 12:
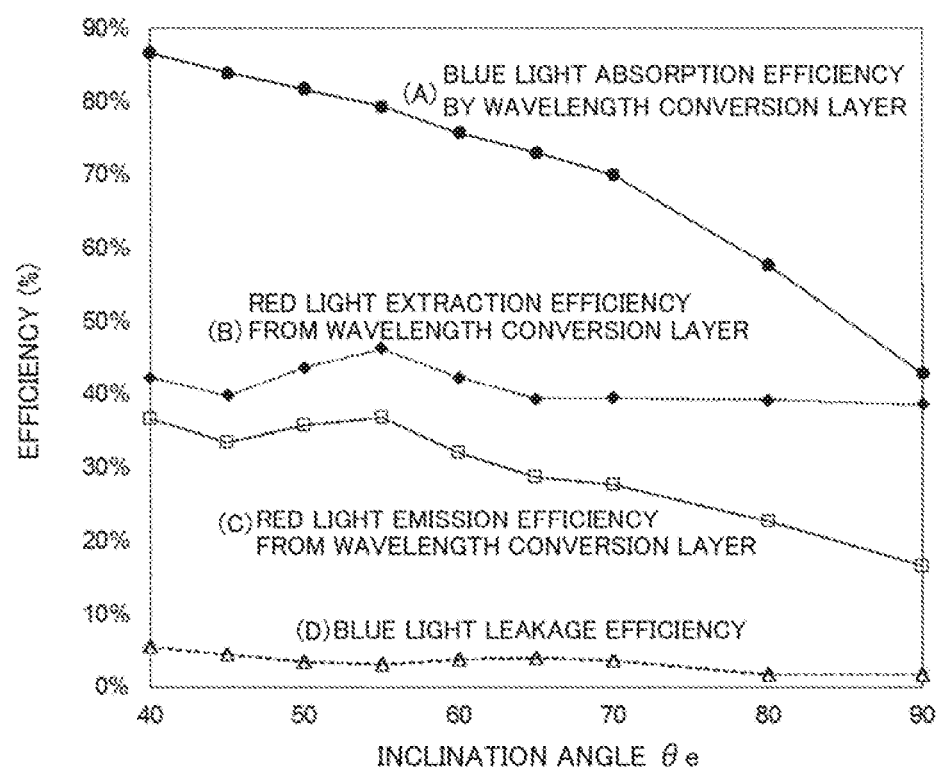
Figure 13:
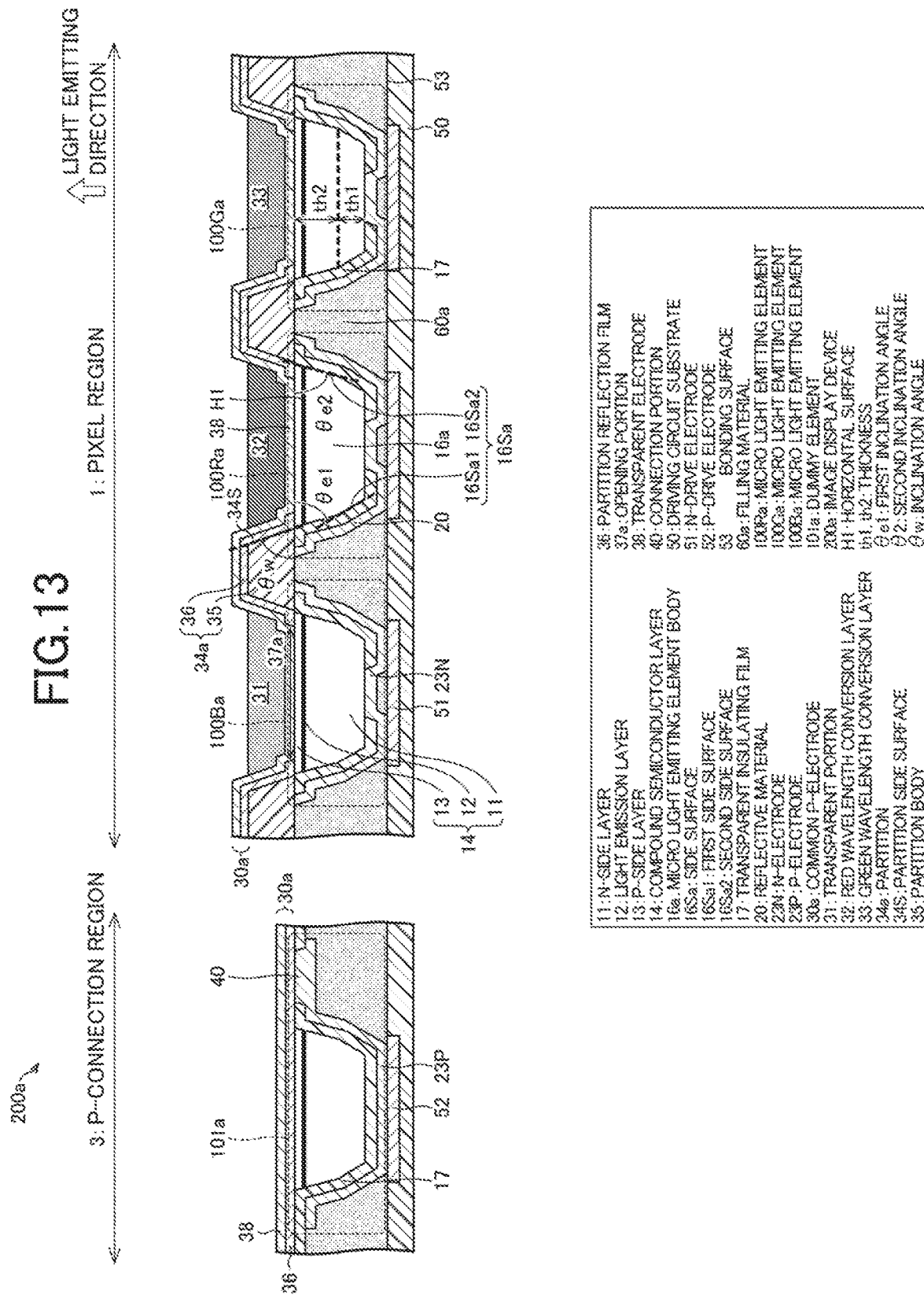
Figure 14:
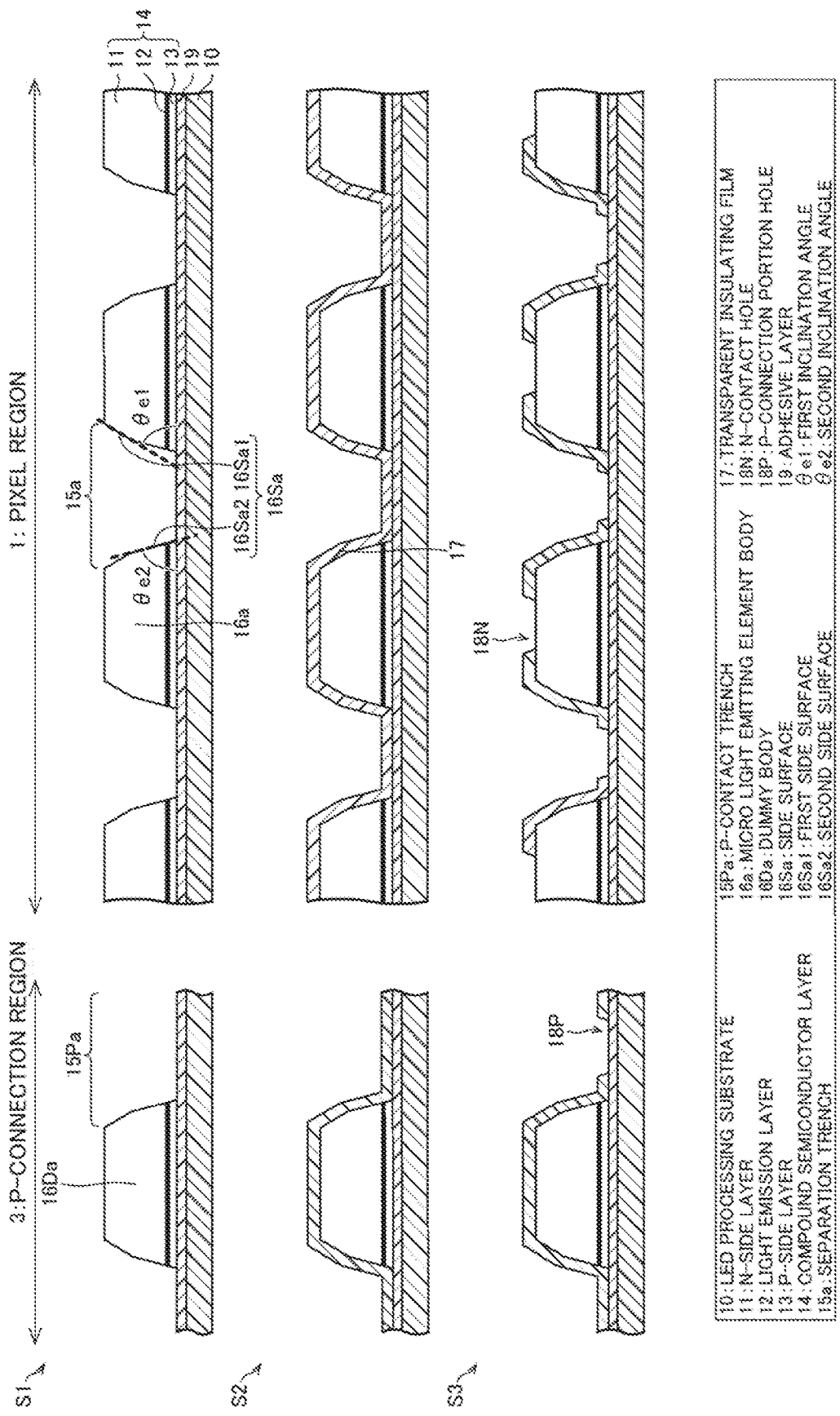
Figure 15:
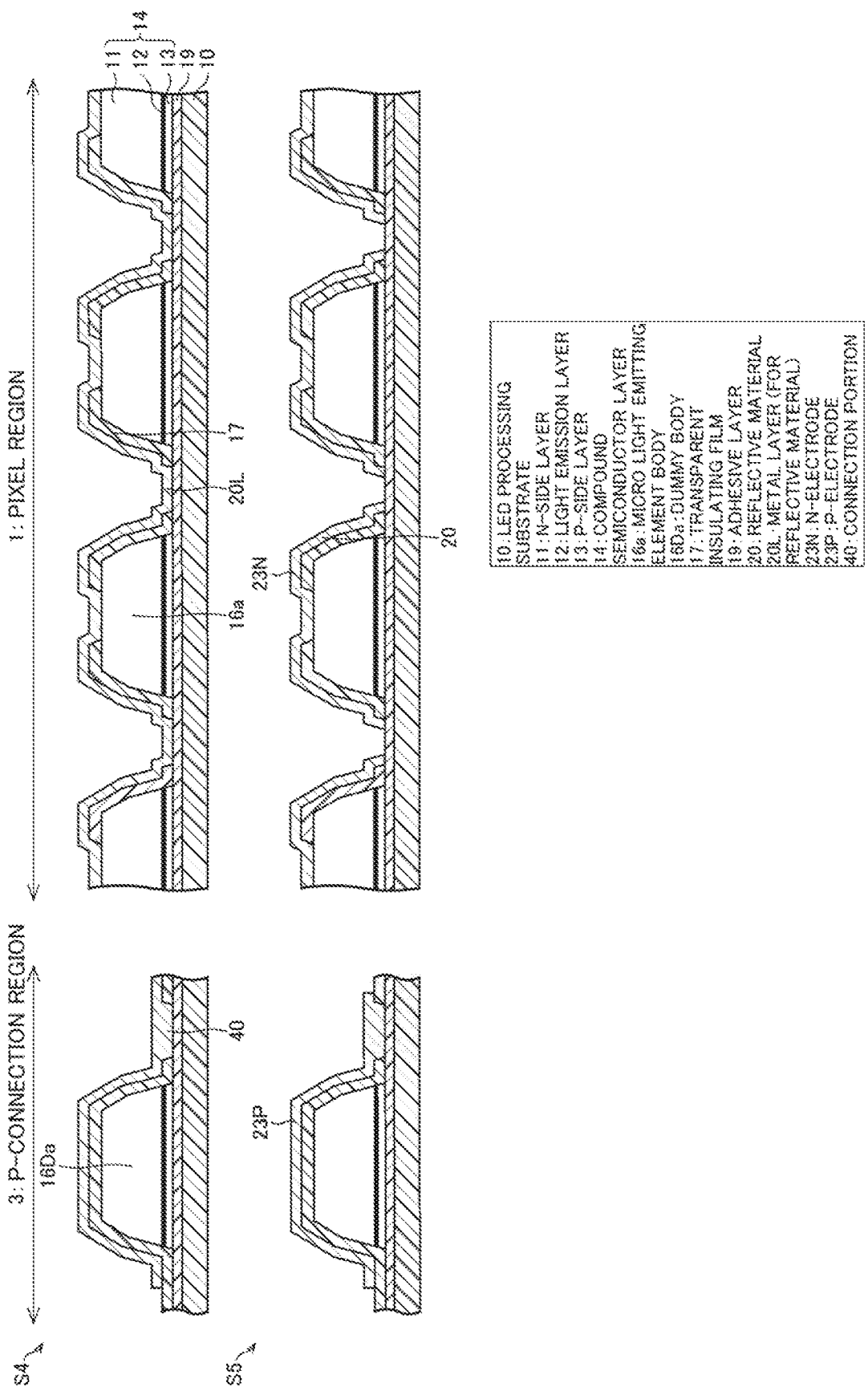
Figure 16:
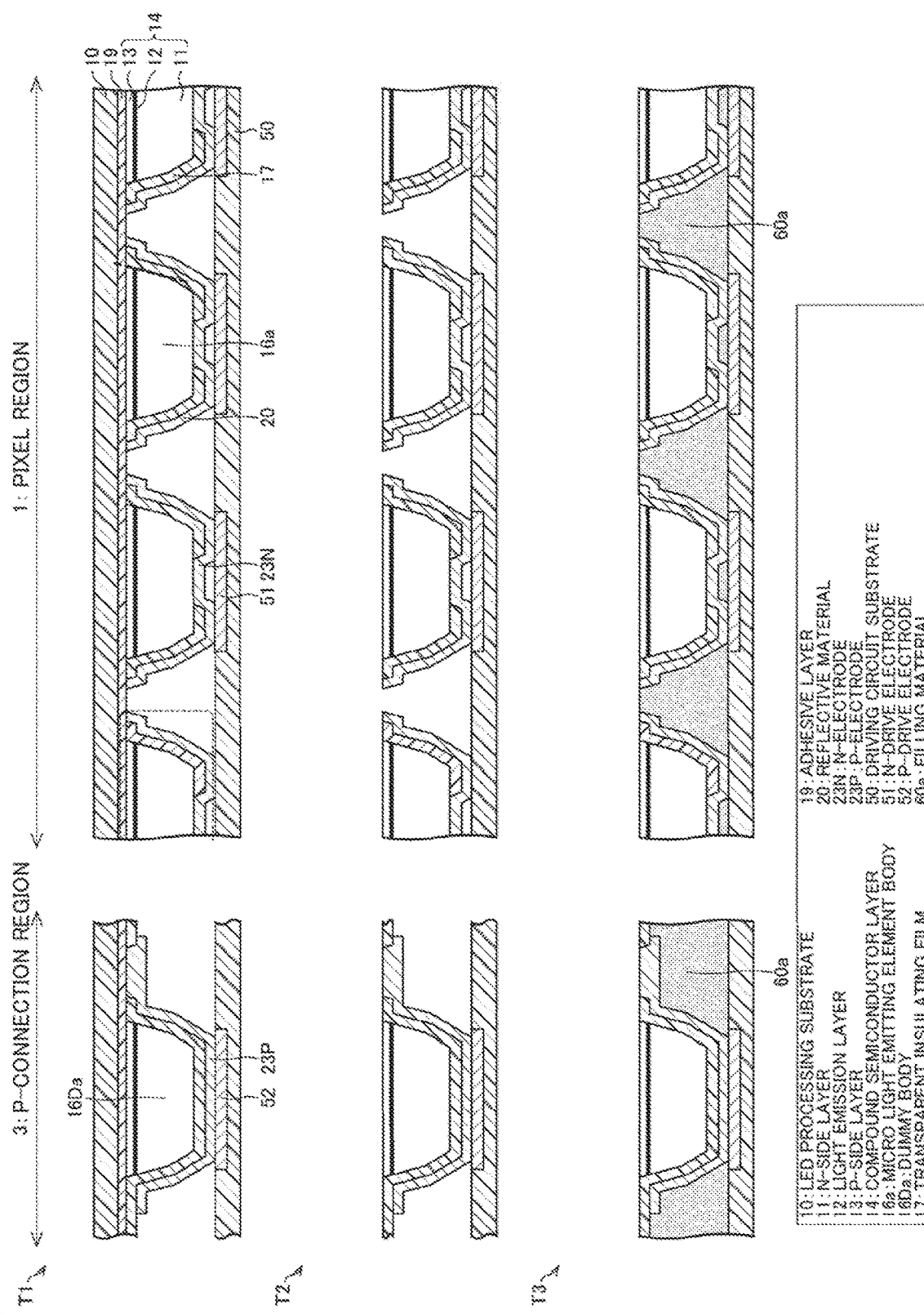
Figure 17:
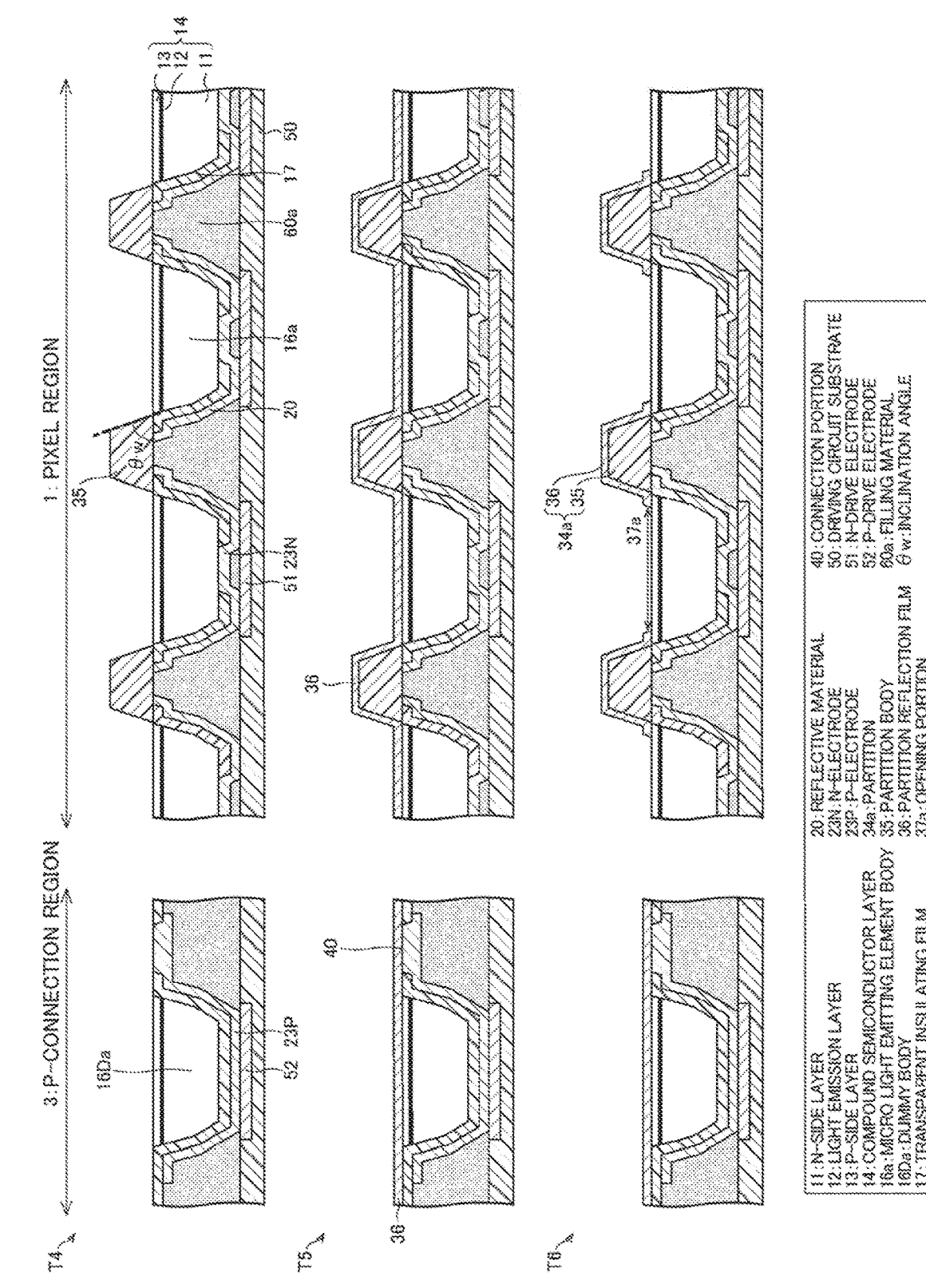
Figure 18:
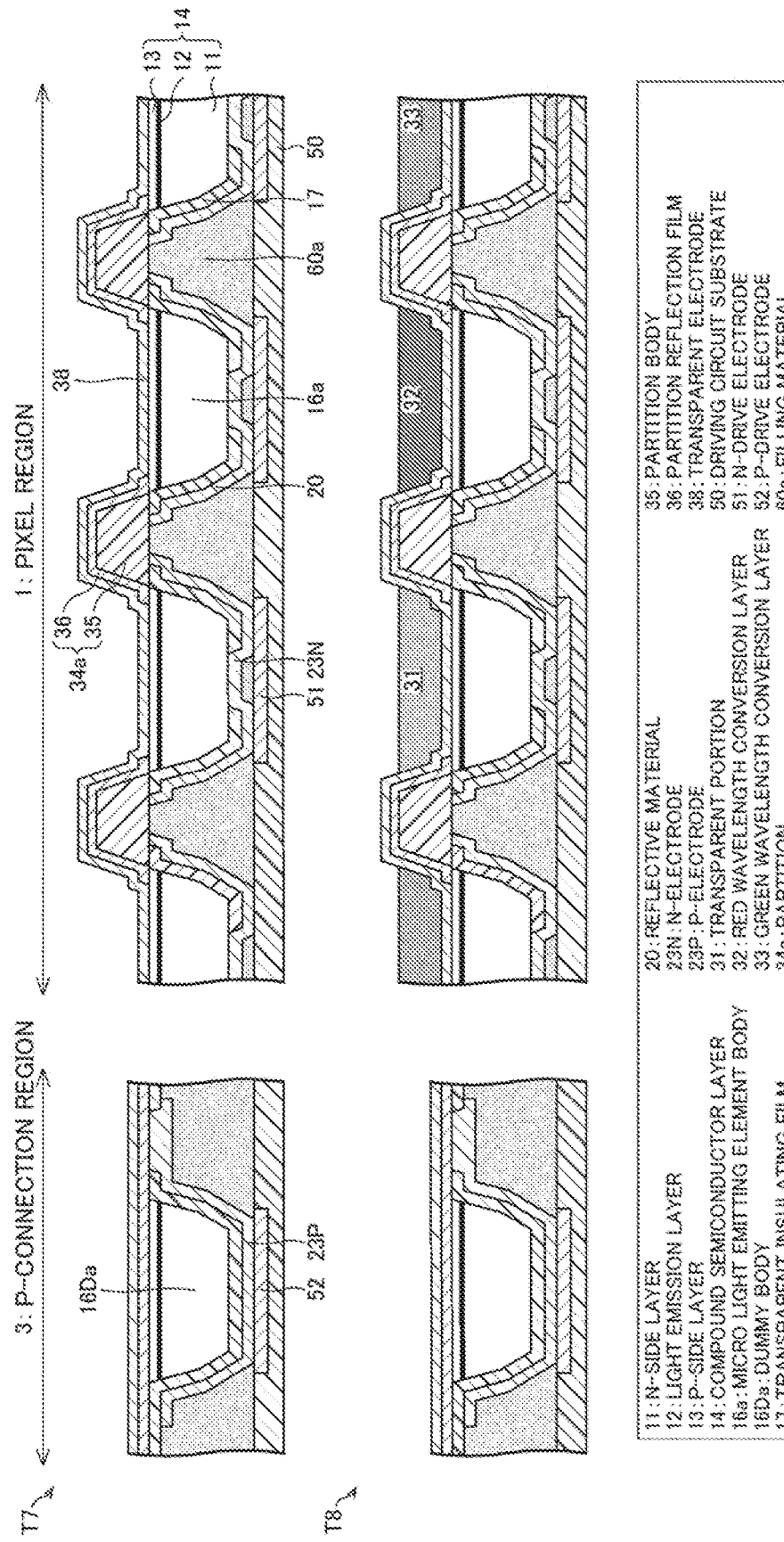
Figure 19:
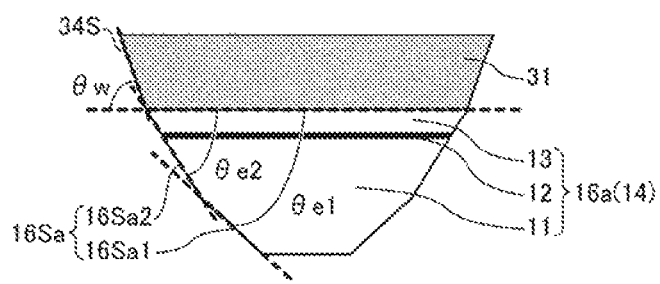
Figure 20:
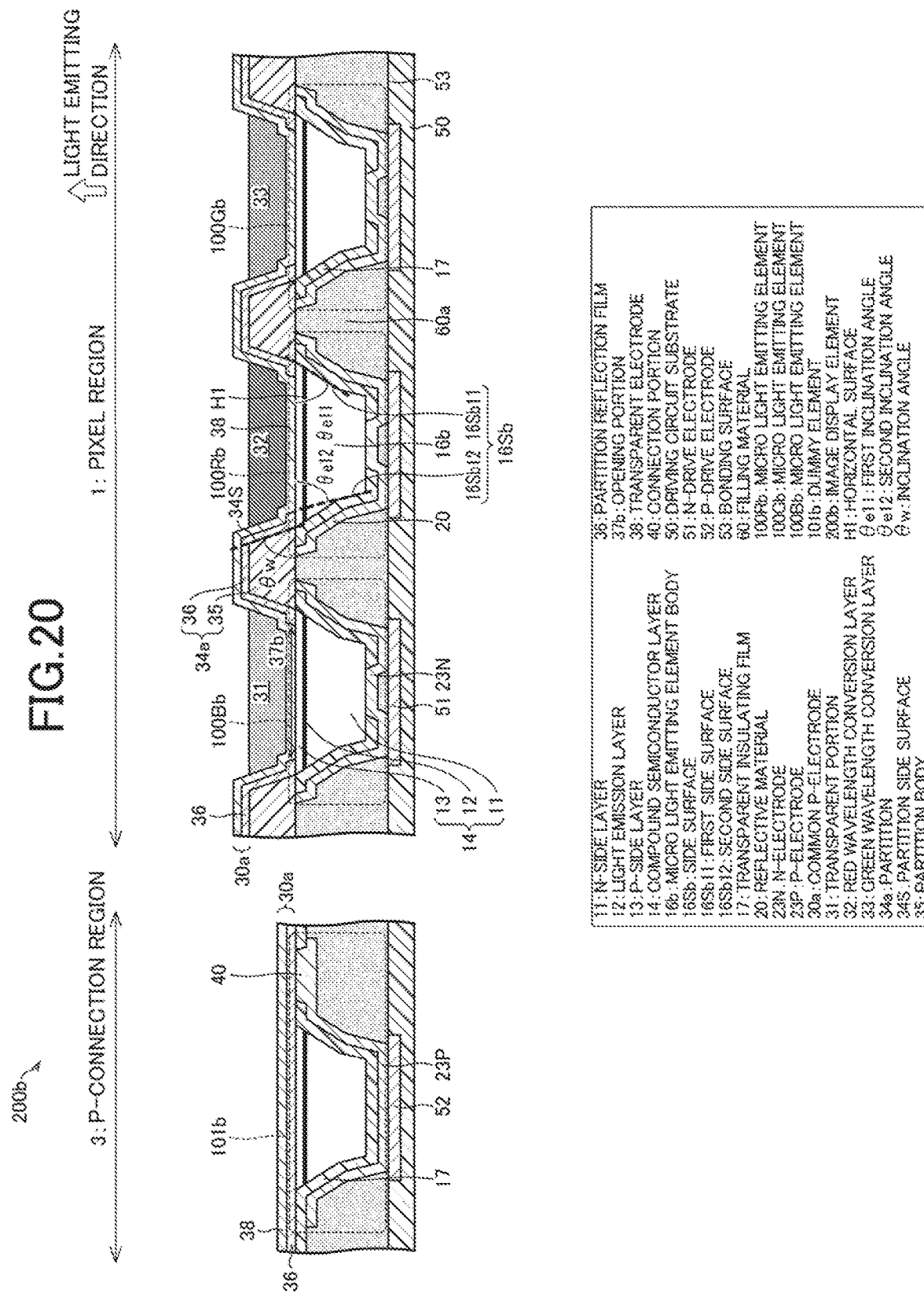
Figure 21:
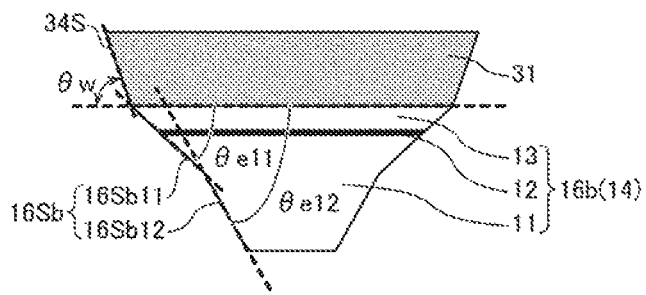
Figure 22:
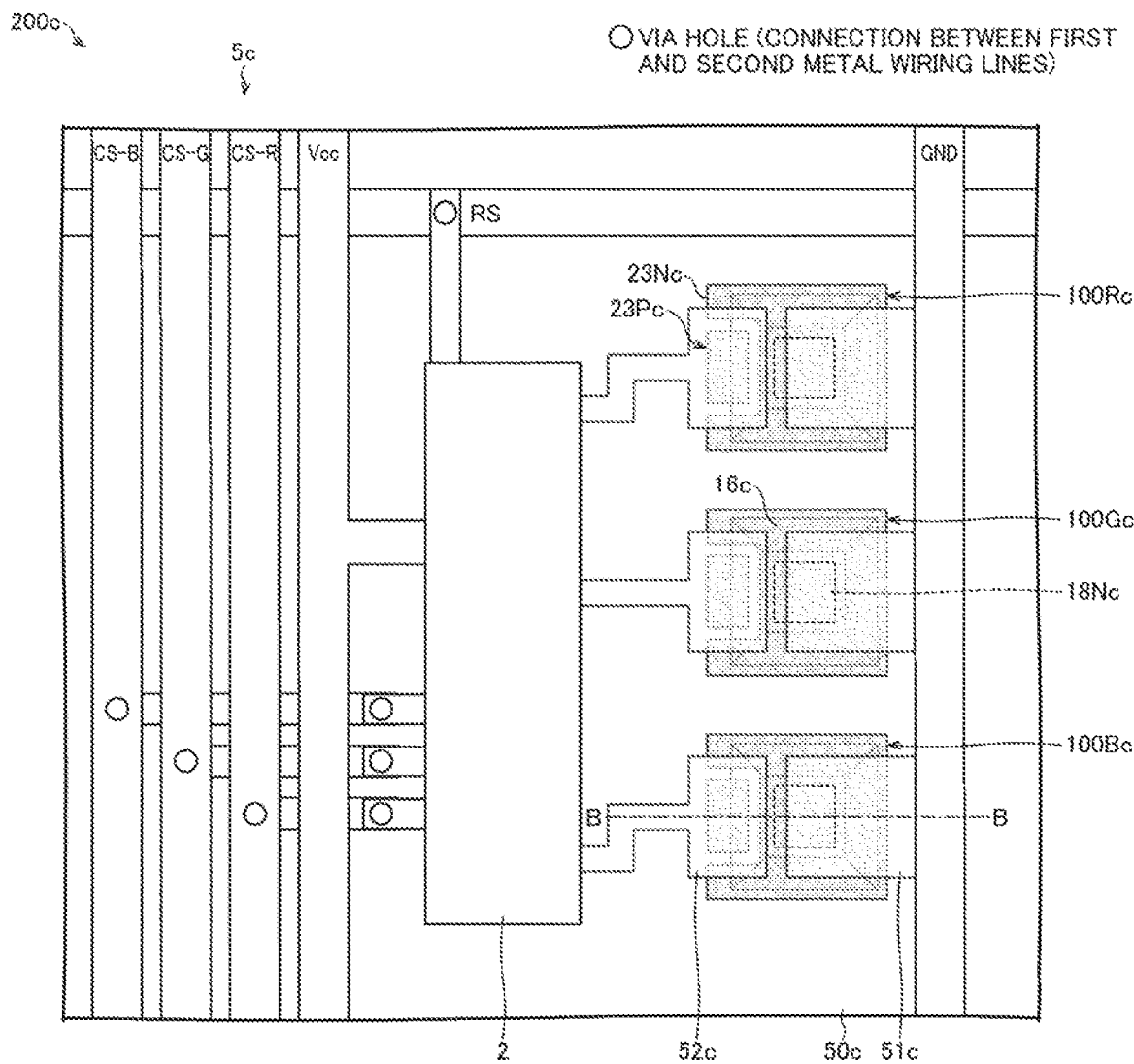
Figure 23:
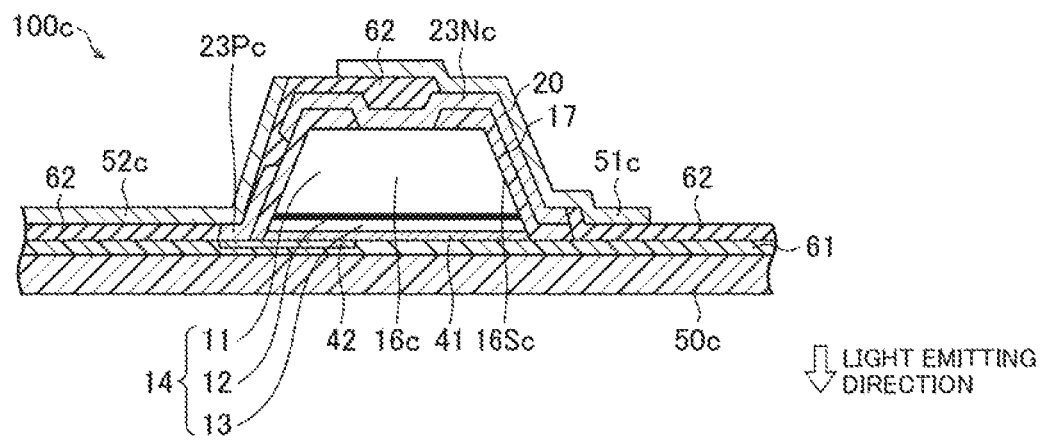
Figure 26:
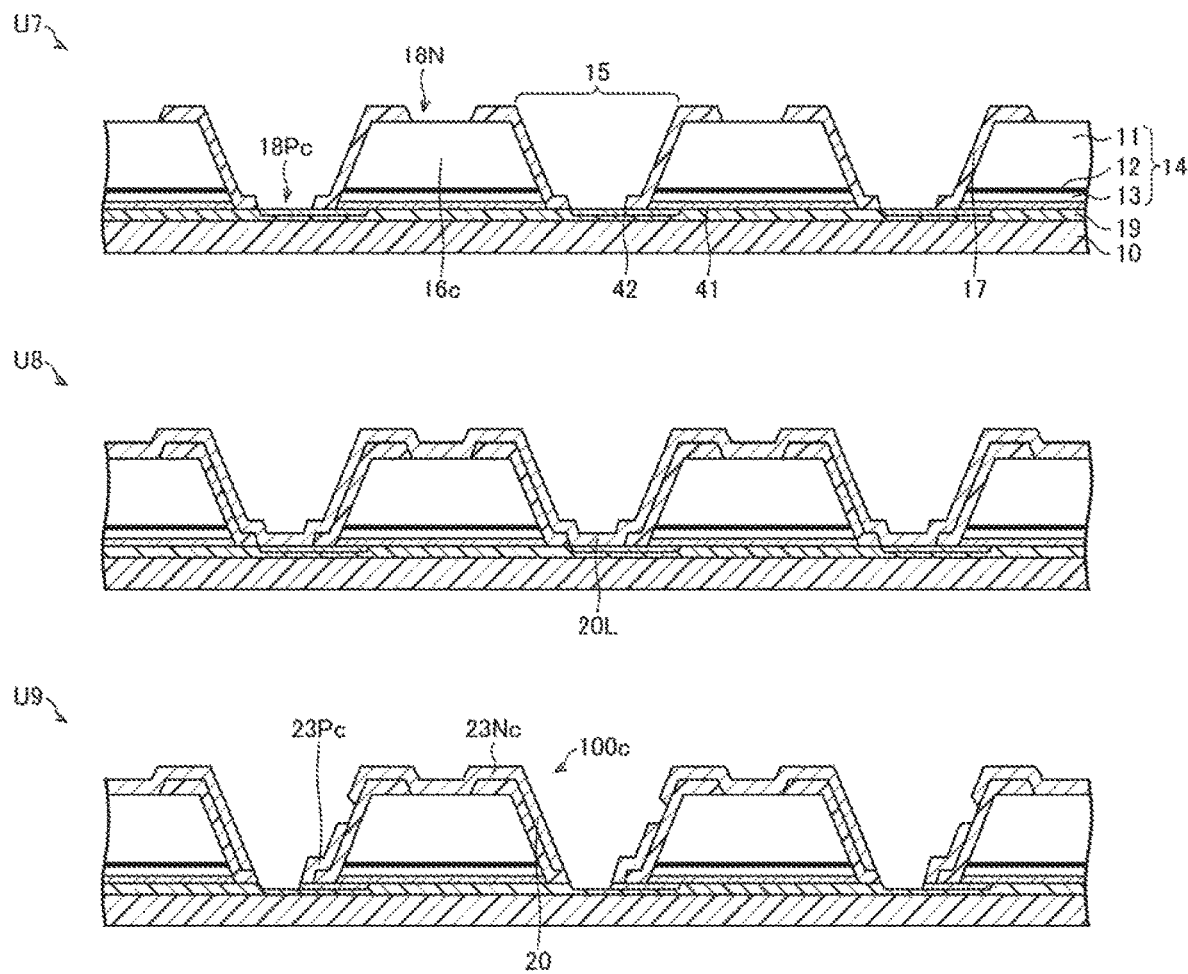
Figure 27:
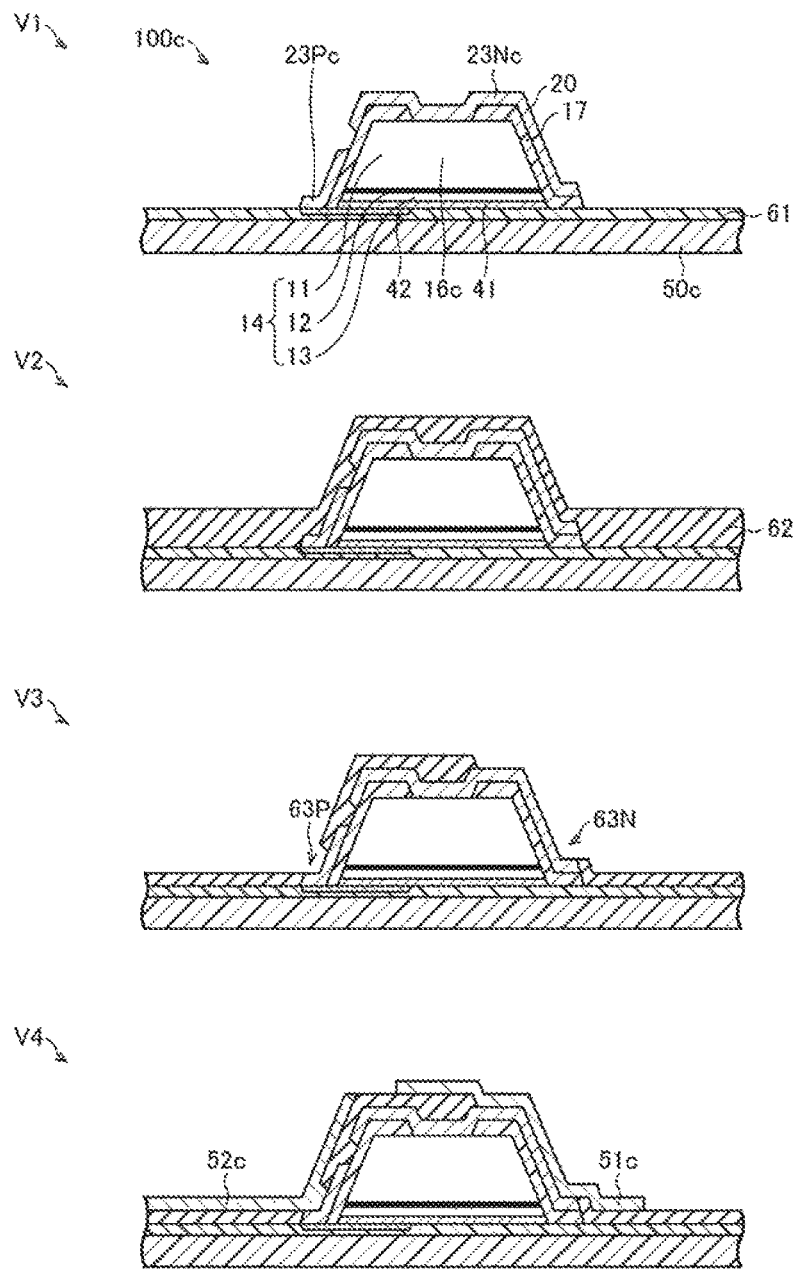
Figure 28:
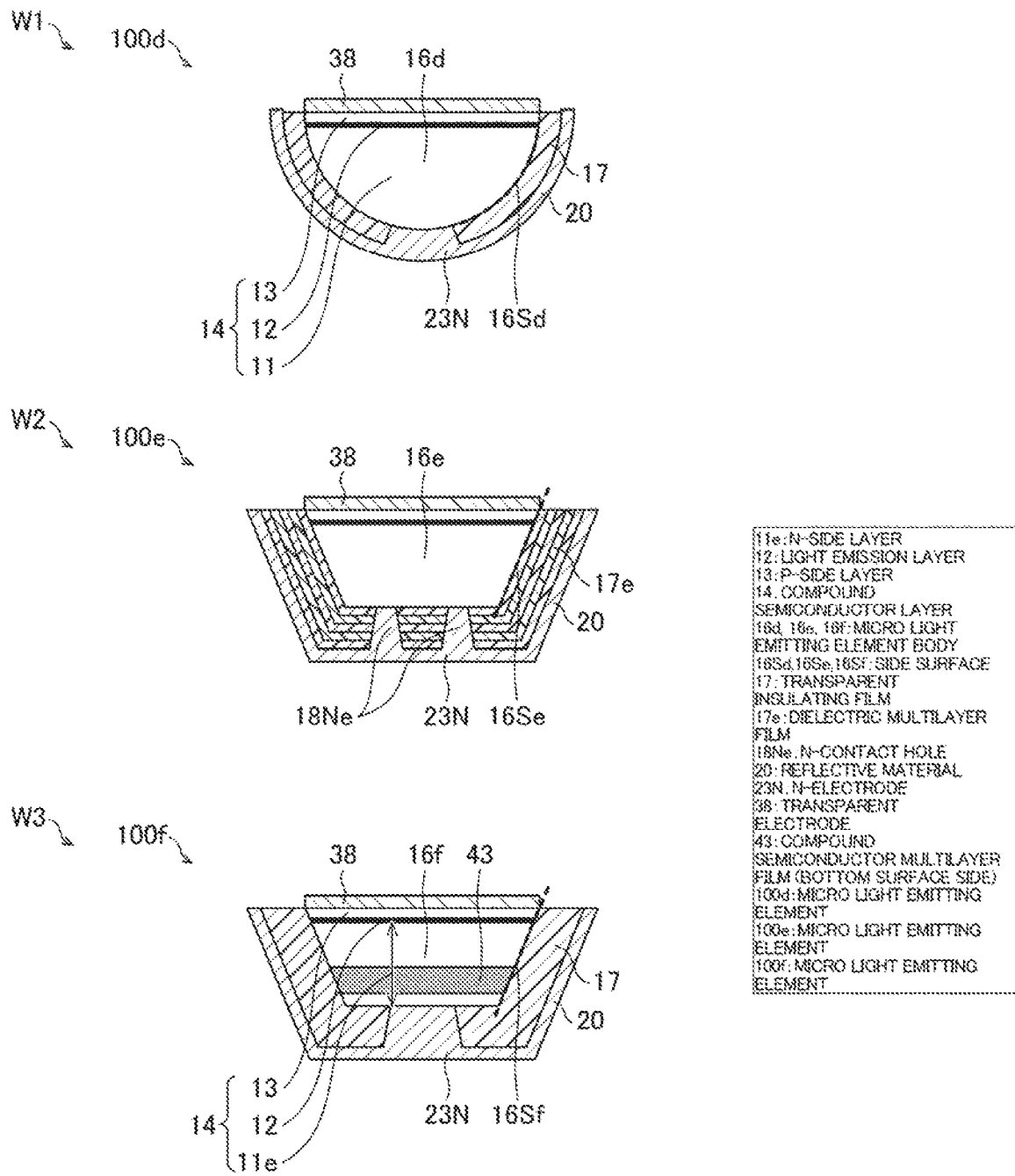
Figure 29:
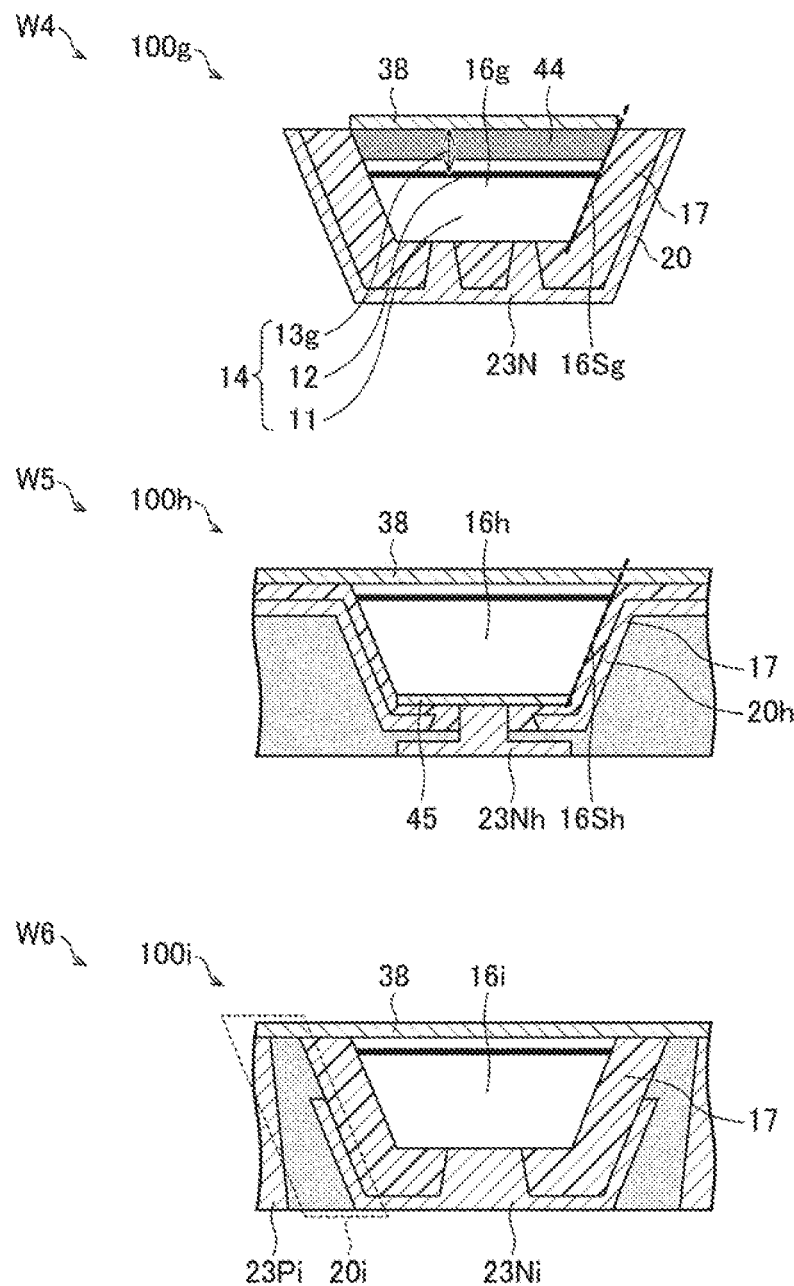

Q1 and Q2 of FIG. 10 are schematic cross-sectional views of other structures simulated for comparison with FIG. 9;

R1 of FIG. 11 is a graph showing a simulation result of dependence of a transparent insulating film on film thickness in light extraction efficiency; R2 of FIG. 11 is a graph showing a simulation result of dependence of a side surface of a body on inclination angle in the light extraction efficiency in the image display device shown in FIG. 1;

FIG. 12 is a simulation result of dependence of red light emission efficiency on inclination angle in a red sub-pixel of the image display device according to the first embodiment of the present disclosure;

FIG. 13 is a schematic cross-sectional view of an image display device according to a second embodiment of the present disclosure;

FIG. 14 is a schematic cross-sectional view of a manufacturing flow of a micro light emitting element according to the second embodiment of the present disclosure;

FIG. 15 is a schematic cross-sectional view of the manufacturing flow of the micro light emitting element, which is a view of the continuation of FIG. 14;

FIG. 16 is a schematic cross-sectional view of the manufacturing flow of the image display device according to the second embodiment of the present disclosure;

FIG. 17 is a schematic cross-sectional view of the manufacturing flow of the image display device, which is a view of the continuation of FIG. 16;

FIG. 18 is a schematic cross-sectional view of the manufacturing flow of the image display device, which is a view of the continuation of FIG. 17;

FIG. 19 is a schematic cross-sectional view of a simulated structure imitating the second embodiment of the present disclosure;

FIG. 20 is a schematic cross-sectional view of an image display device according to a third embodiment of the present disclosure;

FIG. 21 is a schematic cross-sectional view of a simulated structure imitating the third embodiment of the present disclosure;

FIG. 22 is a schematic plan view of a pixel constituting an image display device according to a fourth embodiment of the present disclosure;

FIG. 23 is a schematic cross-sectional view of a micro light emitting element mounting portion of the image display device according to the fourth embodiment of the present disclosure;

FIG. 24 is a schematic cross-sectional view of a manufacturing flow of a micro light emitting element according to the fourth embodiment of the present disclosure;

FIG. 25 is a schematic cross-sectional view of the manufacturing flow of the micro light emitting element, which is a view of the continuation of FIG. 24;

FIG. 26 is a schematic cross-sectional view of the manufacturing flow of the micro light emitting element, which is a view of the continuation of FIG. 25;

FIG. 27 is a schematic cross-sectional view of the manufacturing flow of the image display device according to the fourth embodiment of the present disclosure, which is the micro light emitting element mounting portion;

FIG. 28 is a schematic cross-sectional view of modification examples of the micro light emitting element according to the first embodiment of the present disclosure; and FIG. 29 is a schematic cross-sectional view of other modification examples of the micro light emitting element according to the first embodiment of the present disclosure.

DETAILED DESCRIPTION OF THE EMBODIMENTS

First Embodiment

Configuration of Image Display Device 200

Figure 1:
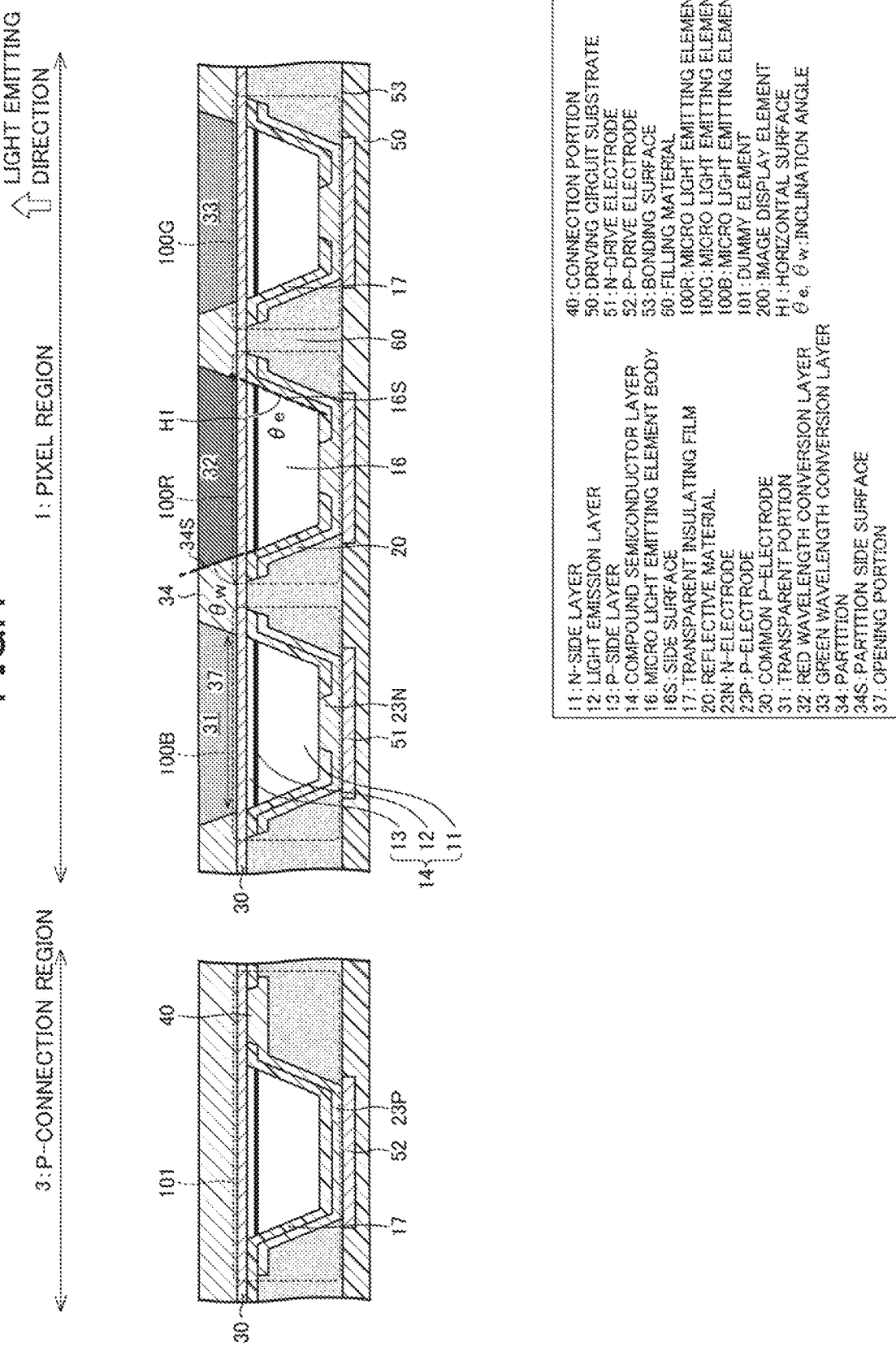
FIG. 1 is a schematic cross-sectional view of an image display device according to a first embodiment of the present disclosure.
Figure 2:
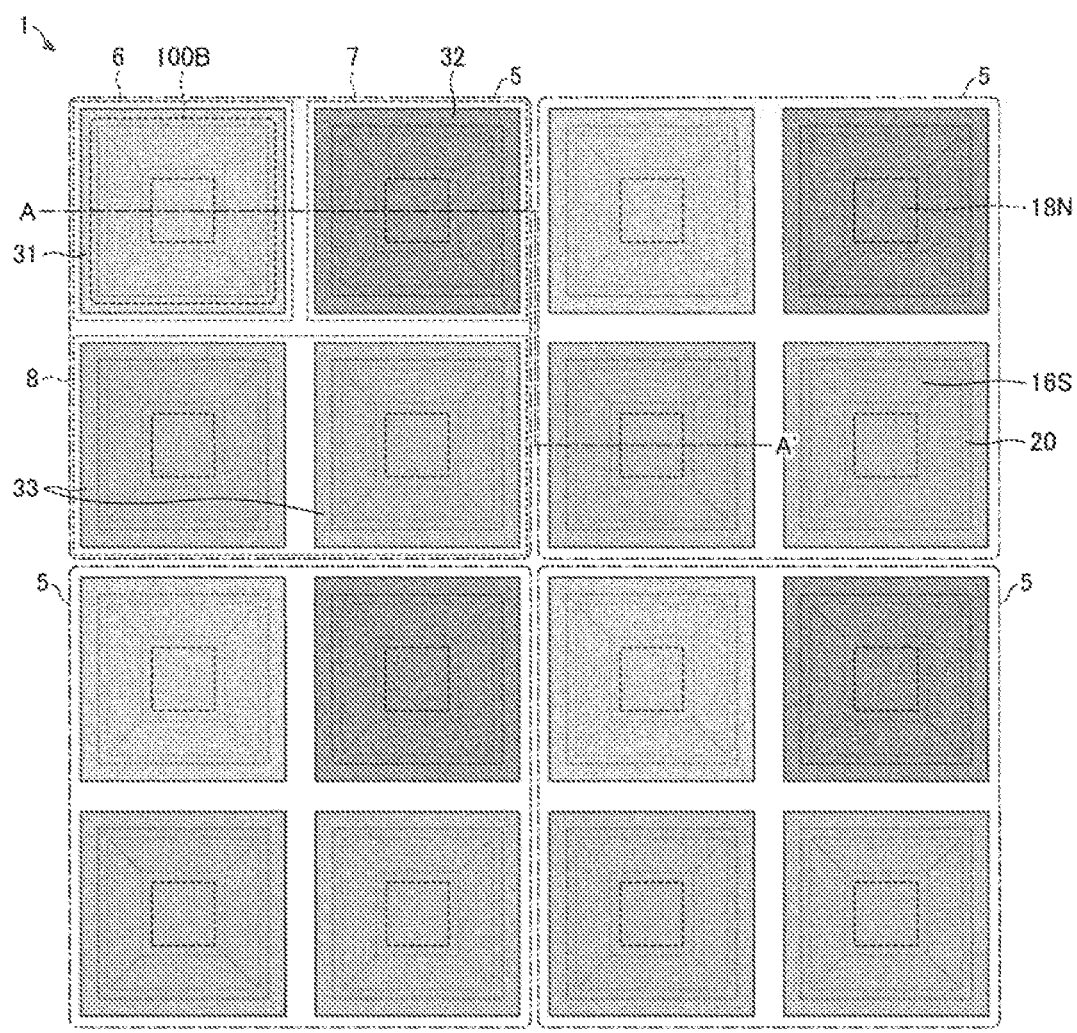
FIG. 2 is a schematic plan view of a pixel region of the image display device according to the first embodiment of the present disclosure.

FIG. 1 is a schematic cross-sectional view of an image display device 200 according to a first embodiment of the present disclosure. FIG. 2 is a schematic plan view of a pixel region of the image display device 200 according to the first embodiment of the present disclosure. Hereinafter, the image display device 200 will be described with the image display device 200 having a plurality of micro light emitting elements 100 as an example with reference to FIGS. 1 to 8.

In the description of a configuration of the image display device 200, a light emitting surface is referred to as an upper surface, a surface opposite to the light emitting surface side is referred to as a lower surface, and a surface on a side other than the upper surface and the lower surface is referred to as a side surface. In the micro light emitting element 100, up and down directions are indicated by having a light emitting surface side as an upper side and having a side opposite to the light emitting surface side as a lower side. The up and down directions shown below are for convenience of description and are not limited to the directions for the embodiments of the present disclosure.

When a micro light emitting element of each light emission color is distinguished, an alphanumerical reference representing the color, such as 100R, 100G, or 100B, is provided as an annotation subsequent to the micro light emitting element. In a case where no alphanumerical reference is provided, the entire micro light emitting element is denoted. The same applies to other components of the micro light emitting element 100.

As shown in FIG. 1, the image display device 200 includes the plurality of micro light emitting elements 100 (micro light emitting element 100B, micro light emitting element 100R, and micro light emitting element 100G) and a driving circuit substrate 50. The driving circuit substrate 50 includes a driving circuit that supplies a current to the micro light emitting element 100B, the micro light emitting element 100R, and the micro light emitting element 100G in a pixel region 1 to control light emission. The pixel region 1 is a region in which the micro light emitting elements 100 are disposed in a two-dimensional array on the driving circuit substrate 50, and the image display device 200 has the pixel region 1.

In the pixel region 1, pixels 5 are disposed in an array as shown in FIG. 2, and each pixel 5 includes a blue sub-pixel 6, a red sub-pixel 7, and a green sub-pixel 8. The blue sub-pixel 6, the red sub-pixel 7, and the green sub-pixel 8 respectively emit blue light, red light, and green light, and light of various colors can be emitted as the pixel 5 by adjusting respective intensities. The pixel region 1 in FIG. 1 represents a cross-sectional view of a portion taken along a line A-A' in FIG. 2.

The blue sub-pixel 6, the red sub-pixel 7, and the green sub-pixel 8 respectively include the micro light emitting element 100B, the micro light emitting element 100R, and the micro light emitting element 100G. The micro light emitting element 100B, the micro light emitting element 100R, and the micro light emitting element 100G have the same structure and emit blue light. Hereinafter, the entire micro light emitting element 100B, micro light emitting element 100R, and micro light emitting element 100G are referred to as the micro light emitting element 100 as described above.

In FIG. 2, the green sub-pixel is configured of two micro light emitting elements 100G, but the number of the micro light emitting elements 100 constituting each sub-pixel may be one or plural. Although the micro light emitting element 100 is drawn in a shape close to a square in FIG. 2, the shape of each micro light emitting element 100 in a top view may be a rectangle, a polygon, a circle, an ellipse, or the like. As described above, various planar shapes may be employed as the shape of the micro light emitting element 100 in a top view. However, a maximum length along the longitudinal direction of the upper surface of the micro light emitting element 100 is 60 μm or less. In the image display device 200, 3,000 or more micro light emitting elements 100 are integrated in the pixel region 1.

Micro Light Emitting Element 100

Each of the micro light emitting elements 100 includes a micro light emitting element body 16 (hereinafter simply referred to as body 16) made of a nitride semiconductor, an N-electrode 23N (second electrode), and a common P-electrode 30 (first electrode, light emitting surface side electrode). The common P-electrode 30 is disposed on the light emitting surface side of the body 16 and the N-electrode 23N is disposed on the driving circuit substrate 50 side. The body 16 is obtained by separating a compound semiconductor layer 14 described below by a separation trench 15 for each micro light emitting element 100.

In the configuration of the present embodiment, a P-side layer 13 of the compound semiconductor layer 14 is disposed on the light emitting surface side, and an N-side layer 11 is disposed on the driving circuit substrate 50 side. A thickness of the P-side layer 13 is about ⅕ to ⅒ of that of the N-side layer 11. Thus, a light emission layer 12 is disposed near the light emitting surface (upper surface of the compound semiconductor layer 14) in the compound semiconductor layer 14. In other words, the light emission layer 12 is disposed at a position closer to the upper surface than the lower surface of the compound semiconductor layer 14 in a stacking direction of the compound semiconductor layer 14. That is, the light emission layer 12 is placed between the light emitting surface and the middle of the body 16. Therefore, the light emission layer 12 is unevenly distributed on the light emitting surface side of the compound semiconductor layer 14.

The N-electrode 23N is connected to an N-drive electrode 51 on the driving circuit substrate 50. The common P-electrode 30 is connected to a P-drive electrode 52 on the driving circuit substrate 50 in a P-connection region 3 outside the pixel region 1. Each micro light emitting element 100 is supplied with a current from the corresponding N-drive electrode 51 and emits light. A light emitting direction is a direction opposite to the driving circuit substrate 50 with respect to the body 16 and is a common P-electrode 30 side. The micro light emitting element 100B, the micro light emitting element 100R, and the micro light emitting element 100G are individually separated, and a space between the respective micro light emitting elements 100 is filled with a filling material 60 which is an insulating material.

The blue light emitted from the micro light emitting element 100B passes through a transparent portion 31 on the upper surface of the micro light emitting element 100B and is emitted to the outside as it is. On the other hand, the blue light emitted from the micro light emitting element 100R is absorbed by a red wavelength conversion layer 32, converted into red light, and emitted to the outside. Similarly, the blue light emitted from the micro light emitting element 100G is absorbed by a green wavelength conversion layer 33, converted into green light, and emitted to the outside. In other words, the red wavelength conversion layer 32 and the green wavelength conversion layer 33 (wavelength conversion layers) absorb excitation light (blue light) emitted from the micro light emitting element 100, convert the absorbed light into long-wavelength light (red or green) longer than the excitation light, and emit the converted light to the outside. In FIG. 1, the transparent portion 31, the red wavelength conversion layer 32, and the green wavelength conversion layer 33 are depicted as in contact with the common P-electrode 30, but there may be thin layers between them.

The transparent portion 31, the red wavelength conversion layer 32, and the green wavelength conversion layer 33 are isolated by a partition 34. The blue light from the compound semiconductor layer 14 of each micro light emitting element 100 passes through an opening portion 37 between the partitions 34 formed on the upper portion of each micro light emitting element 100, and is incident on the transparent portion 31, the red wavelength conversion layer 32, or the green wavelength conversion layer 33. Light reflected inside the transparent portion 31, the red wavelength conversion layer 32, or the green wavelength conversion layer 33 passes through the opening portion 37 and is incident on the compound semiconductor layer 14.

A light diffusion layer, a color filter, a microlens, or the like may be disposed on the transparent portion 31, the red wavelength conversion layer 32, the green wavelength conversion layer 33, and the partition 34, but is not directly related to one aspect of the present disclosure and thus is not shown in the drawing.

Compound Semiconductor Layer 14

As described above, each micro light emitting element 100 includes the compound semiconductor layer 14. The compound semiconductor layer 14 is configured by stacking the P-side layer 13 (first conductive layer), the light emission layer 12, and the N-side layer 11 (second conductive layer) in order from the light emitting surface side. The P-side layer 13 has a conductive type opposite to that of the N-side layer 11, that is, an opposite polarity.

In the following, a configuration in which the P-side layer 13 is disposed on the light emitting surface side will be described for the compound semiconductor layer 14. However, a configuration in which the N-side layer 11 is disposed on the light emitting surface side may be employed. Each of the N-side layer 11, the light emission layer 12, and the P-side layer 13 is usually optimized with a plurality of layers instead of a single layer. However, the fact is not directly related to one aspect of the present disclosure, and thus detailed structures of the N-side layer 11, the light emission layer 12, and the P-side layer 13 will not be described in detail.

The light emission layer 12 is usually sandwiched between an N-type layer and a P-type layer. However, there is a case where the N-type layer or the P-type layer includes a non-doped layer, or in some cases, a layer with a dopant having an opposite conductivity (conductive type). Therefore, in this specification, a semiconductor layer on the side including the N-type layer is the N-side layer 11 and a semiconductor layer on the side including the P-type layer is the P-side layer 13, for the two layers sandwiching the light emission layer 12. In a GaN-based compound semiconductor, Si is generally used as an N-type dopant contained in the N-type layer and Mg is generally used as a P-type dopant contained in the P-type layer.

The case of adding the dopant "having the opposite conductivity" to the N-side layer 11 or the P-side layer 13 corresponds to, for example, a case of adding Si to a part of the P-type layer. That is, the P-type layer is used as a whole, but a part of the P-type layer contains the N-type dopant having a low concentration.

Driving Circuit Substrate 50

The driving circuit substrate 50 is configured of a micro light emitting element driving circuit, a row selection circuit, a column signal output circuit, an image processing circuit, an input and output circuit, and the like. The micro light emitting element driving circuit controls the current supplied to each micro light emitting element 100. The row selection circuit selects each row of the micro light emitting elements 100 disposed in a two-dimensional matrix. The column signal output circuit outputs a light emission signal to each column. The image processing circuit calculates the light emission signal based on an input signal.

The N-drive electrode 51 and the P-drive electrode 52, which are connected to the micro light emitting element 100, are disposed on a surface of the driving circuit substrate 50 on a bonding surface 53 side. That is, the surface of the driving circuit substrate 50 faces a surface of the micro light emitting element 100 opposite to the light emitting surface side. The driving circuit substrate 50 may generally be a silicon substrate (semiconductor substrate) on which an LSI (integrated circuit) is formed, or a glass substrate or a resin substrate on which a circuit of a thin film transistor (TFT) is formed. Since any of the substrates can be manufactured by a known technique, a function and a configuration thereof will not be described in detail.

The N-drive electrodes 51 for supplying the current to the micro light emitting element 100 are disposed in a two-dimensional array on a surface of the pixel region 1 in the driving circuit substrate 50. The P-drive electrode 52 is disposed on a surface outside the pixel region 1 (surface of the P-connection region 3) in the driving circuit substrate 50. The P-drive electrode 52 is electrically connected to the common P-electrode 30 through a dummy element 101. In the dummy element 101, the common P-electrode 30 and a P-electrode 23P are electrically connected through a connection portion 40. The dummy element 101 is connected to the P-drive electrode 52 by the same connection method as the connection method between the body 16 and the N-drive electrode 51 in the micro light emitting element 100.

The surface of the driving circuit substrate 50 is a bonding surface 53 for bonding with the plurality of micro light emitting elements 100, and the plurality of micro light emitting elements 100 are bonded to the surface thereof. In the present embodiment, the micro light emitting element 100 is a so-called vertical electrode type. The micro light emitting element 100 has the N-electrode 23N on one surface and the common P-electrode 30 on the other surface.

Specifically, in the micro light emitting element 100, the common P-electrode 30 is disposed on the light emitting surface side, and the N-electrode 23N is disposed on the surface opposite to the light emitting surface side. The light emitting surface of the micro light emitting element 100 is the upper surface of the micro light emitting element 100, and the surface opposite to the light emitting surface of the micro light emitting element 100 is the lower surface of the micro light emitting element 100. The N-electrode 23N and the N-drive electrode 51 are connected in a one-to-one relationship.

In the pixel region 1, the N-electrode 23N connected to the N-side layer 11 is disposed on the lower surface of the micro light emitting element 100, and the N-electrode 23N is connected to the N-drive electrode 51 on the driving circuit substrate 50. The N-electrode 23N conducts the current supplied from the driving circuit substrate 50 to the N-side layer 11. In the present embodiment, only the structure in which the N-electrode 23N and the N-drive electrode 51 are directly connected is shown. However, a member for connection such as a bump, a paste, or a nanoparticle may be interposed between the electrodes. The same applies to the P-electrode 23P and the P-drive electrode 52.

The current passing through the N-side layer 11 further passes through the light emission layer 12 and the P-side layer 13, flows into the common P-electrode 30, and flows into the P-drive electrode 52 of the driving circuit substrate 50 in the P-connection region 3 outside the pixel region 1. As described above, the micro light emitting element 100 emits light with a predetermined intensity according to an amount of current supplied from the driving circuit substrate 50.

A metal layer having a high reflectance for visible light is preferably disposed on a side of the N-electrode 23N in contact with the N-side layer 11. For example, the N-electrode 23N has a metal layer M1 (not shown) mainly composed of silver or aluminum on the N-side layer 11 side. It is preferable to form good ohmic contact between the metal layer M1 and the N-side layer 11. On the other hand, it is preferable to dispose a metal material that is easily connected to the N-drive electrode 51 on a side of the N-electrode 23N in contact with the driving circuit substrate 50. The metal material is, for example, gold or copper. As described above, the N-electrode 23N is configured of a plurality of metal layers and barrier layers.

Common P-Electrode 30

The common P-electrode 30 is composed of a transparent conductive layer electrically connected to the P-side layer 13, that is, a transparent conductive film. The common P-electrode 30 may be an oxide semiconductor such as indium tin oxide (ITO) or indium zinc oxide (IZO), or may be a silver nanofiber film, or the like. The common P-electrode 30 is preferably as thin as possible in order to reduce the absorption of blue light. The thinning of the common P-electrode 30 causes an increase in a wiring resistance. However, in the configuration of the present embodiment, the partition 34 which is a conductive material is electrically connected to the common P-electrode 30 and is disposed in the entire pixel region 1. Therefore, the wiring resistance between the P-drive electrode 52 and the micro light emitting element 100 can be kept low.

Side Surface 16S of Body

The compound semiconductor layer 14 constituting the micro light emitting element 100 is separated into the main bodies 16 by the separation trench 15. Thus, the adjacent micro light emitting elements 100 are not connected through a part of the compound semiconductor layer 14. That is, a side surface 16S of the body 16 extends from one surface (bottom surface of the N-side layer 11) of the compound semiconductor layer 14 to the other surface (surface of the P-side layer 13) thereof as shown in FIG. 1. Thus, it is possible to prevent light leakage between the adjacent micro light emitting elements 100.

In the present embodiment, as shown in FIG. 2, the micro light emitting element 100 has a quadrangular planar shape, and the side surface 16S of the body 16 includes four surfaces. In a case where the micro light emitting element 100 has a polygonal planar shape and the number of sides is N (N is a natural number), N side surfaces 16S are formed. In a case where the micro light emitting element 100 has a circular planar shape, the side surface 16S is configured of a truncated cone type side surface.

The side surface 16S is preferably tapered to open in the light emitting direction. The side surface 16S has a constant (uniform) inclination angle θe. The inclination angle θe is an angle formed by the side surface 16S and a horizontal surface H1 (upper surface) of the light emitting surface. The inclination angle θe of the side surface 16S is preferably about 30° or more and 80° or less. The inclination angle θe is preferably constant, but may change depending on the manufacturing flow.

In the configuration of the present embodiment, the light emission layer 12 is near the light emitting surface. Thus, even though the inclination angle θe is set small in order to improve the light extraction efficiency, it is hard to reduce an area of the horizontal surface of the light emission layer 12. On the other hand, in a case where the light emission layer 12 is provided on the lower side (on the side opposite to the light emitting surface side), the area of the horizontal surface of the light emission layer 12 is reduced when the inclination angle θe is reduced. When the area of the horizontal surface of the light emission layer 12 is reduced, the current density of the current passing through the light emission layer 12 is increased and the internal quantum efficiency is reduced. Thus, in a case where the size of the micro light emitting element 100 is small (for example, in a case where a long side of the upper surface of the micro light emitting element 100 is 10 μm or less), it is possible to improve the characteristics of the micro light emitting element by disposing the light emission layer 12 on the light emitting surface side as in the configuration of the present embodiment.

The side surface 16S is covered with a transparent insulating film 17, and the transparent insulating film 17 is covered with a reflective material 20. That is, the side surface 16S is covered with the reflective material 20 (first reflective material) facing the side surface 16S with the transparent insulating film 17 sandwiched therebetween. The reflective material 20 and the N-electrode 23N are made of a metal material having a high reflectance for the visible light, and a surface of the reflective material 20 and a surface of the N-electrode 23N on the body 16 side are reflective surfaces that reflect the visible light.

The transparent insulating film 17 is disposed between the side surface 16S of the body 16 and the reflective material 20. The transparent insulating film 17 is preferably a substance, such as $SiO_2$, which is transparent to the visible light and has a refractive index smaller than that of the compound semiconductor layer 14. The transparent insulating film 17 is disposed between the side surface 16S and the reflective material 20. A film thickness of the transparent insulating film 17 is preferably 75 nm or more, and more preferably 400 nm or more particularly.

In the configuration of the present embodiment, the N-electrode 23N is extended onto the side surface 16S to configure the reflective material 20 that covers the side surface 16S in order to simplify the manufacturing flow. However, the reflective material 20 is not always requested to be connected to the N-electrode 23N. The reflective material 20 may be configured of a single layer or plural layers. The reflective material 20 preferably has a metal layer M2 (not shown) mainly composed of silver or aluminum, which has a large reflectance for the visible light, on the transparent insulating film 17 side, that is, on the compound semiconductor layer 14 side. The metal layer M2 may be made of the same material as the metal layer M1 described above. The reflective material 20 is requested to shield light, and the total thickness thereof is preferably several tens of nm or more.

The N-electrode 23N and the reflective material 20 are preferably disposed to cover the entire micro light emitting element 100 in plan view from the side opposite to the light emitting surface side. In the plan view from the side opposite to the light emitting surface side, when there is an exposed portion of the compound semiconductor layer 14, light is emitted to the outside and the emission thereto causes the optical crosstalk. Therefore, it is preferable that there is no such an exposed portion.

In the configuration of the present embodiment, most of a bottom surface and the side surface of the micro light emitting element 100 are covered with the N-electrode 23N and the reflective material 20, and thus the light leakage is very small. However, there is a portion that is not covered with the reflective material 20 in the side surface 16S on the light emitting surface side of the micro light emitting element 100. Thus, the filling material 60 is preferably a light shielding material in order to prevent the optical crosstalk through this portion.

A light absorbing material such as carbon black, white resin containing a $TiO_2$ particle, or the like may be used as such a filling material 60. In FIG. 1, it is possible to obtain the same effect also when the light shielding material is disposed on the upper portion of the filling material 60 and the transparent material is disposed on the lower portion thereof. In a case where the exposed portion of the transparent insulating film 17 which is not covered with the reflective material 20 is thin and the optical crosstalk is small, the filling material 60 may be a transparent material.

Partition 34 and Partition Side Surface 34S

The partitions 34 that respectively partition the transparent portion 31, the red wavelength conversion layer 32, and the green wavelength conversion layer 33 are made of a metal material. A partition side surface 34S, which is a side surface of the partition 34, is formed of a metal material having a high reflectance for the visible light, as in the case of the reflective material 20. The partition side surface 34S is tapered to open in the light emitting direction. That is, the partition side surface 34S is inclined in a forward tapered manner from the upper side to the lower side in the transparent portion 31, the red wavelength conversion layer 32, and the green wavelength conversion layer 33.

An inclination angle θw of the partition side surface 34S is preferably smaller than 90° and more preferably about 45° to 80°. The inclination angle θw is an angle formed between the partition side surface 34S and the upper surface of the common P-electrode 30. This is because when the inclination angle θw decreases, a bottom portion width of the partition 34 increases, thus the width of the partition 34 occupying a length of one side of the sub-pixel (blue sub-pixel 6, red sub-pixel 7, and green sub-pixel 8) increases, as a result, the micro light emitting element 100 becomes smaller. In a case where an area of the sub-pixel is small, an area of the micro light emitting element 100 becomes also small and an effective area of the light emission layer 12 becomes further small. Thus, the current density passing through the light emission layer 12 is increased, and thus the light emission efficiency is decreased or the temperature is increased.

In the red wavelength conversion layer 32, the blue light is absorbed and the red light is generated. There is not much red light emitted directly into the air of the generated red light. A part of the generated red light is lost due to reflection in the red wavelength conversion layer 32. Most of the generated red light is incident on the body 16, is reflected in the body 16, and returns to the red wavelength conversion layer 32 again. A part of the red light returned to the red wavelength conversion layer 32 is emitted into the air, and the remaining thereof is lost due to the reflection in the red wavelength conversion layer 32 or is incident on the body 16 again. As described above, when the red light is emitted to the outside, it is very important to reduce the loss due to the reflection in the red wavelength conversion layer 32 and to efficiently return the red light incident on the body 16 to the red wavelength conversion layer 32. The same is true for the green light.

For the blue light incident on the transparent portion 31 from the micro light emitting element 100B, a considerable portion of the light is also reflected at an interface between the transparent portion 31 and the air. A part of the blue light reflected in this manner is lost due to the reflection at the transparent portion 31, and a remaining portion is incident on the body 16, is reflected in the body 16, and returns to the transparent portion 31 again. Therefore, for the blue light, it is very important to reduce the loss due to the reflection in the transparent portion 31 and to efficiently return the blue light incident on the body 16 to the transparent portion 31, as in the case of red light.

In order to reduce the loss of light due to reflection inside the transparent portion 31, the red wavelength conversion layer 32, and the green wavelength conversion layer 33, it is requested to cover the transparent portion 31, the red wavelength conversion layer 32, and the green wavelength conversion layer 33 with a material having a high reflectance, except for a connection portion with the micro light emitting element 100. For that purpose, it is important that the partition side surface 34S is made of a high reflectance metal film and that the opening portion 37 of the partition 34 is present inside an inner edge of an upper end portion of the reflective material 20 of the micro light emitting element 100. The high reflectance metal film refers to a metal film that reflects the visible light (including long-wavelength light (red light and green light) or excitation light (blue light)) and has a high reflectance.

The partition 34 functions as the reflective surface that reflects the red light, the green light, and the blue light by forming the partition side surface 34S with the high reflectance metal film. Therefore, it is possible to prevent light from leaking to the partition 34, improve the reflectance in the partition side surface 34S, and reduce the loss of light. The opening portion 37 of the partition 34 is disposed inside the inner edge of the upper end portion of the reflective material 20 of the micro light emitting element 100. Therefore, the filling material 60 is not exposed when the micro light emitting element 100 is viewed, in a top view, from the transparent portion 31, the red wavelength conversion layer 32, and the green wavelength conversion layer 33. Accordingly, it is possible to reduce the loss and the optical crosstalk due to the light leakage from the transparent portion 31, the red wavelength conversion layer 32, and the green wavelength conversion layer 33 to the filling material 60. Thus, it is possible to guide all the light emitted downward from the transparent portion 31, the red wavelength conversion layer 32, and the green wavelength conversion layer 33 to the micro light emitting element 100 and to return the light to the transparent portion 31, the red wavelength conversion layer 32, and the green wavelength conversion layer 33 through the micro light emitting element 100.

Manufacturing Flow of Micro Light Emitting Element 100

Figure 3:
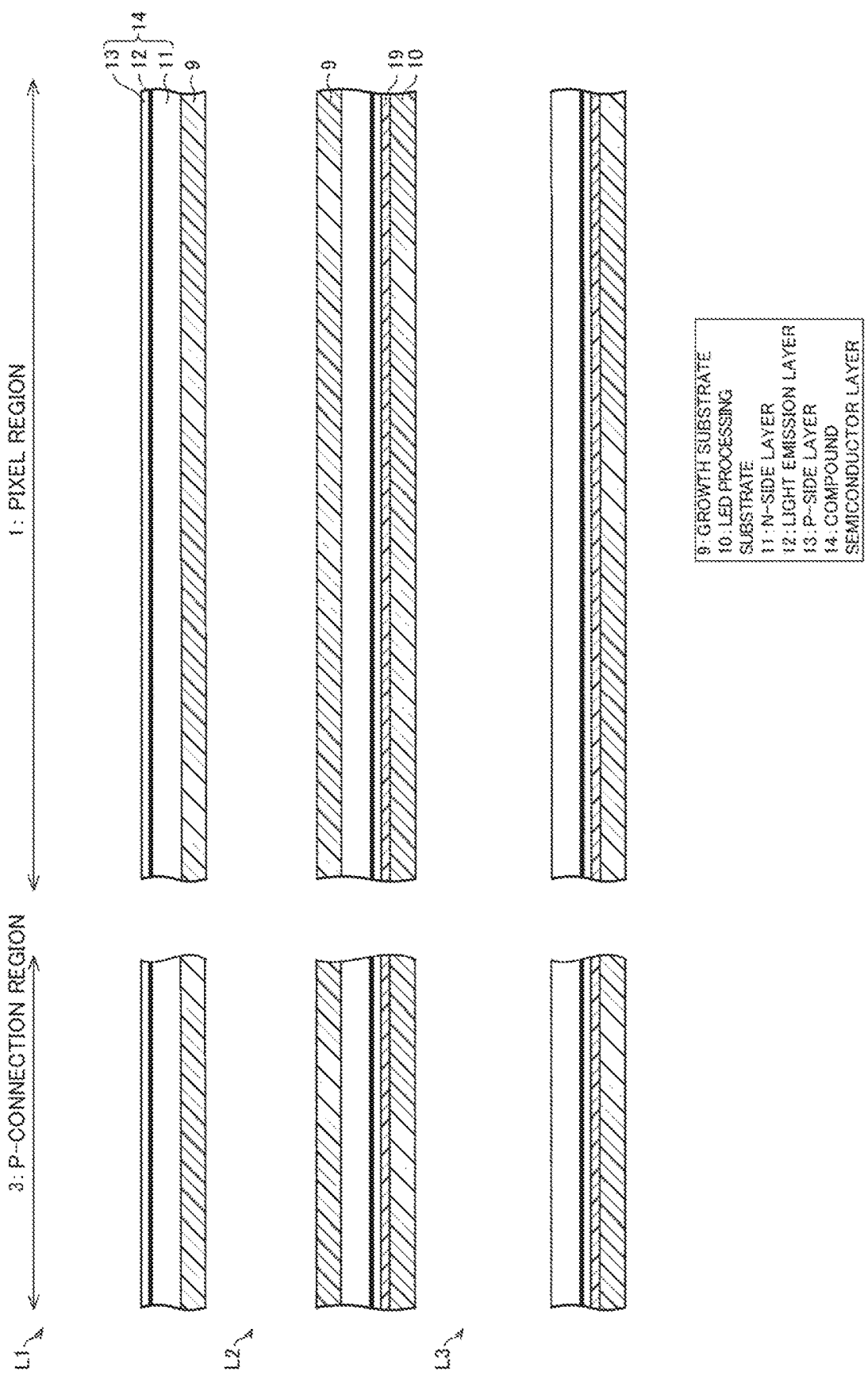
FIG. 3 is a schematic cross-sectional view of a manufacturing flow of a micro light emitting element according to the first embodiment of the present disclosure.
Figure 4:
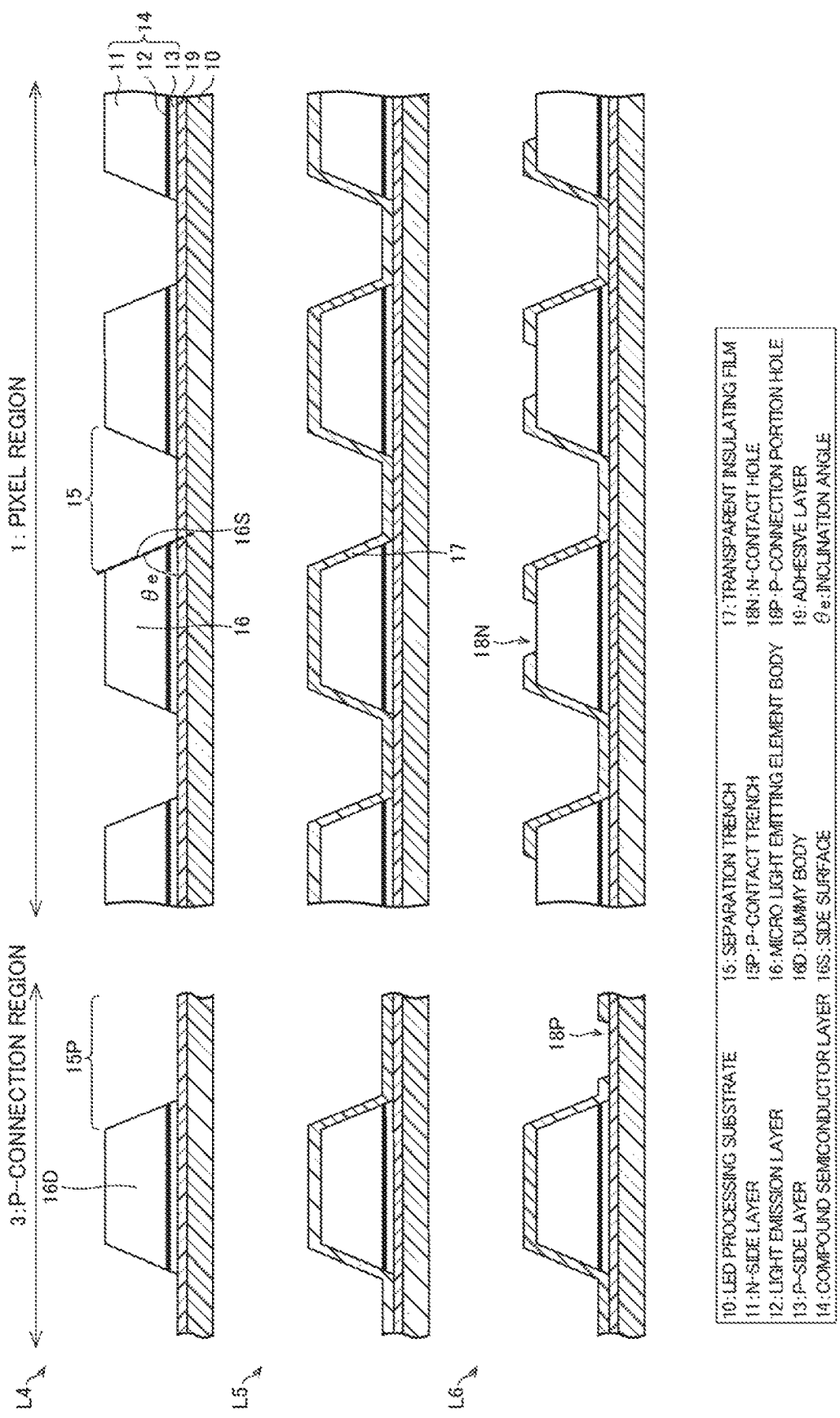
FIG. 4 is a schematic cross-sectional view of the manufacturing flow of the micro light emitting element, which is a view of the continuation of FIG. 3.
Figure 5:
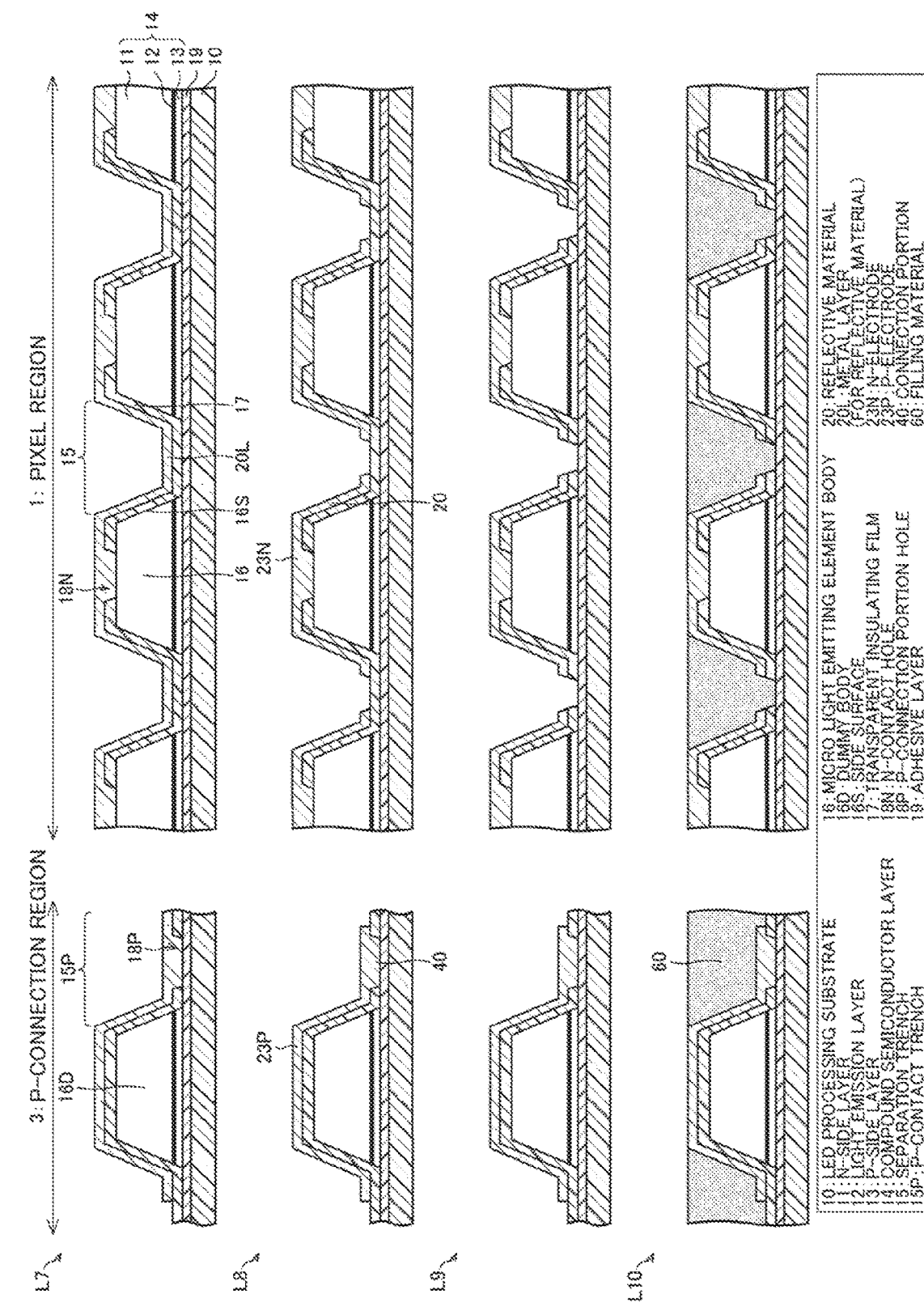
FIG. 5 is a schematic cross-sectional view of the manufacturing flow of the micro light emitting element, which is a view of the continuation of FIG. 4.

Next, a manufacturing flow of the micro light emitting element 100 will be described with reference to steps L1 to L10 of FIGS. 3 to 5. FIGS. 3 to 5 are schematic cross-sectional views of the manufacturing flow of the micro light emitting element 100 according to the first embodiment of the present disclosure. In the description of the manufacturing flow of the micro light emitting element 100, the N-side layer 11 side is the upper side and the P-side layer 13 side is the lower side.

The cross-sectional views of the pixel region 1 are shown on the right side of steps L1 to L10 in FIGS. 3 to 5, and the cross-sectional views of the P-connection region 3 are shown on the left side of steps L1 to L10 in FIGS. 3 to 5. As shown in step L1 of FIG. 3, the N-side layer 11, the light emission layer 12, and the P-side layer 13 are sequentially stacked on a growth substrate 9 to form the compound semiconductor layer 14.

Next, as shown in step L2 of FIG. 3, the P-side layer 13 side of the compound semiconductor layer 14 is attached to an LED processing substrate 10 through an adhesive layer 19, and the growth substrate 9 is removed as shown in step L3 of FIG. 3. Various methods such as grinding, polishing, plasma etching, wet etching, wet etching of a sacrifice layer, and laser lift-off may be employed to remove the growth substrate 9. At this time, a part of the N-side layer 11 is removed and the thickness of the compound semiconductor layer 14 is adjusted.

Next, as shown in step L4 of FIG. 4, the N-side layer 11, the light emission layer 12, and the P-side layer 13 are etched to form the separation trench 15. The separation trench 15 divides all the layers of the compound semiconductor layer 14 from the surface of the N-side layer 11 to an interface between the P-side layer 13 and the adhesive layer 19. At this time, as shown in FIG. 2, the separation trenches 15 are formed at equal intervals in the up and down direction and the left and right direction in plan view, and the compound semiconductor layer 14 is separated into the main bodies 16 having a shape of truncated pyramid type. A dummy body 16D is similarly formed in the P-connection region 3.

However, the shape of the body 16 is not limited to the truncated pyramid type and may be the truncated cone type or another polygonal truncated pyramid type. Although the separation trench 15 separates the micro light emitting element 100 in the pixel region 1, a P-contact trench 15P is formed at the same time as the separating in the P-connection region 3. The dummy body 16D is not requested to be finely separated like the body 16 and may be continuous in a direction perpendicular to the paper surface of FIG. 4.

The side surface 16S of the body 16 is processed and formed such that the inclination angle $\theta e$, which is the angle formed by the side surface 16S and the horizontal surface H1 of the light emission layer 12, becomes, for example, 45°. The side surface 16S is preferably formed such that the inclination angle $\theta e$ is 30° or more and 80° or less. The light from the light emission layer 12 is isotropically emitted. Therefore, light traveling in a direction parallel to the horizontal surface H1 is overwhelmingly larger than light traveling in a direction perpendicular to the horizontal surface H1 of the light emission layer 12. The light traveling in the direction parallel to the horizontal surface H1 is reflected by the side surface 16S toward the light emitting surface, and thus it is possible to enhance the light extraction efficiency of the micro light emitting element 100. The inclination angle θe may be different for each of a plurality of side surfaces 16S of the body 16. In that case, it is more preferable that there are a plurality of inclination angles θe and that all the inclination angles θe are 30° or more and 80° or less. It is preferable that the side surface of the dummy body 16D is also inclined as in the case of the side surface 16S.

The separation trench 15 is formed, and then the transparent insulating film 17 is deposited so as to cover the exposed portions of the N-side layer 11, the light emission layer 12, the P-side layer 13, and the adhesive layer 19, as shown in step L5 of FIG. 4. A film of $SiO_2$ having a thickness of 400 nm is deposited as the transparent insulating film 17 by a chemical vapor deposition method (CVD). As the transparent insulating film 17, SiN, SiON, or SiCO may be adopted instead of the $SiO_2$ film, or a stacked film of the films may be adopted. It is preferable to form the transparent insulating film 17 by the CVD method in order to make the thickness of the transparent insulating film 17, covering the side surface of the micro light emitting element 100, uniform.

The transparent insulating film 17 is deposited, and then an opening portion is provided in the transparent insulating film 17 as shown in step L6 of FIG. 4. In the pixel region 1, an N-contact hole 18N exposing the surface of the N-side layer 11 is opened on the upper portion of the body 16. In the P-connection region 3, a P-connection portion hole 18P exposing the adhesive layer 19 is provided around the bottom portion of the dummy body 16D. The opening portion can be provided by combining a normal photolithography technique and dry etching technique.

Next, as shown in step L7 of FIG. 5, a metal layer 20L is deposited so as to cover the body 16, the dummy body 16D, the side surface 16S, the separation trench 15, the bottom portion of the P-contact trench 15P, and the like. The metal layer 20L can be deposited by a sputtering method or an evaporation method. The metal layer 20L contacts the N-side layer 11 in the N-contact hole 18N and contacts the adhesive layer 19 in the P-connection portion hole 18P.

Next, as shown in step L8 of FIG. 5, in the pixel region 1, the metal layer 20L at the bottom portion of the separation trench 15 is removed to separate the metal layer 20L for each micro light emitting element 100. Accordingly, the N-electrode 23N is formed on the upper portion of the body of the micro light emitting element 100, and the reflective material 20 is formed so as to cover the compound semiconductor layer 14. In the present embodiment, the N-electrode 23N and the reflective material 20 are connected and are made of the same material.

In the P-connection region 3, the metal layer 20L is removed, leaving at least a region covering from the upper portion of the dummy body 16D to the P-connection portion hole 18P. Accordingly, the P-electrode 23P covering from the P-connection portion hole 18P to the upper portion of the dummy body 16D is formed. The P-connection portion hole 18P becomes the connection portion 40. A part of the metal layer 20L can be removed by combining the normal photolithography technique and dry etching technique. A lift-off method may be used to deposit and partially remove the metal layer 20L at the same time.

Next, as shown in step L9 of FIG. 5, the transparent insulating film 17 at the bottom portion of the separation trench 15 is removed in the pixel region 1. The transparent insulating film 17 in a region between the reflective materials 20 of the adjacent micro light emitting elements 100 is removed. Accordingly, it is possible to prevent the optical crosstalk from occurring between the adjacent micro light emitting elements 100 through the transparent insulating film 17. In a case where the transparent insulating film 17 is thinner than an emission wavelength of the micro light emitting element 100 and in a case where the optical crosstalk is allowed, this step can be omitted.

Next, as shown in step L10 of FIG. 5, the filling material 60 is disposed around the body 16 and the dummy body 16D. The surfaces of the N-electrode 23N and the P-electrode 23P are requested to be exposed. A space between the main bodies 16 and a space between the body 16 and the dummy body 16D are preferably filled with the filling material 60.

The filling material 60 preferably has a light shielding property in order to prevent the optical crosstalk. A cut surface of the transparent insulating film 17 at the bottom portion of the filling material 60 causes the optical crosstalk. Therefore, a two-layer structure may be employed in which the cut surface of the transparent insulating film 17 at the bottom portion of the filling material 60 is covered with a light shielding substance and a transparent substance is disposed on the light shielding substance. In the case where the transparent insulating film 17 is thinner than an emission wavelength of the micro light emitting element 100 and in the case where the optical crosstalk is allowed, the filling material 60 may be a light-translucent material.

In the present manufacturing flow, the filling material 60 is formed on the LED processing substrate 10, but the filling material 60 may be formed on the driving circuit substrate 50. That is, the LED processing substrate 10 may be bonded to the driving circuit substrate 50 in step L9 state of FIG. 5, the LED processing substrate 10 may be peeled off, and then the filling material 60 may be formed.

Manufacturing Flow of Image Display Device 200

Figure 6:
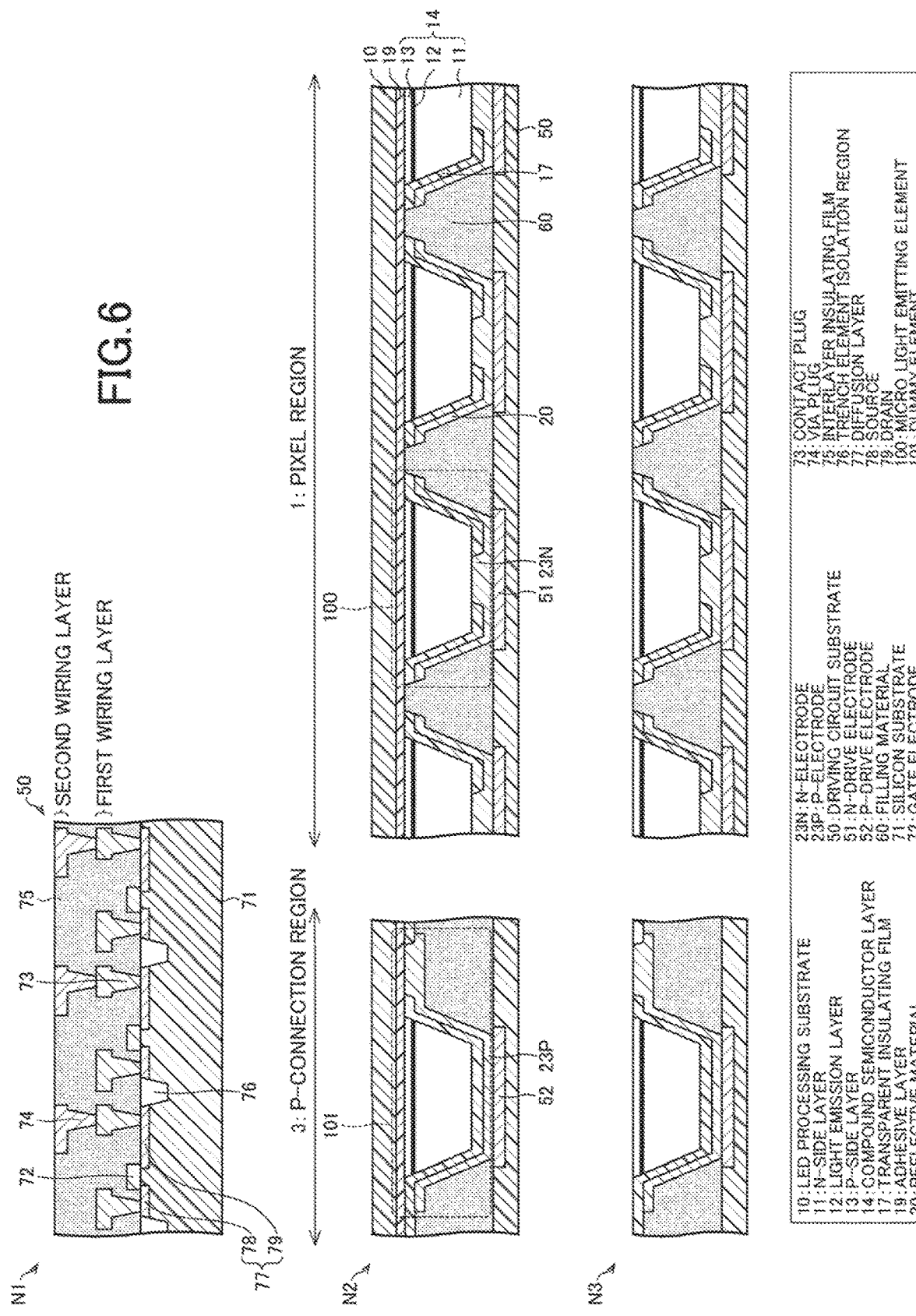
FIG. 6 is a schematic cross-sectional view of a manufacturing flow of the image display device according to the first embodiment of the present disclosure.
Figure 7:
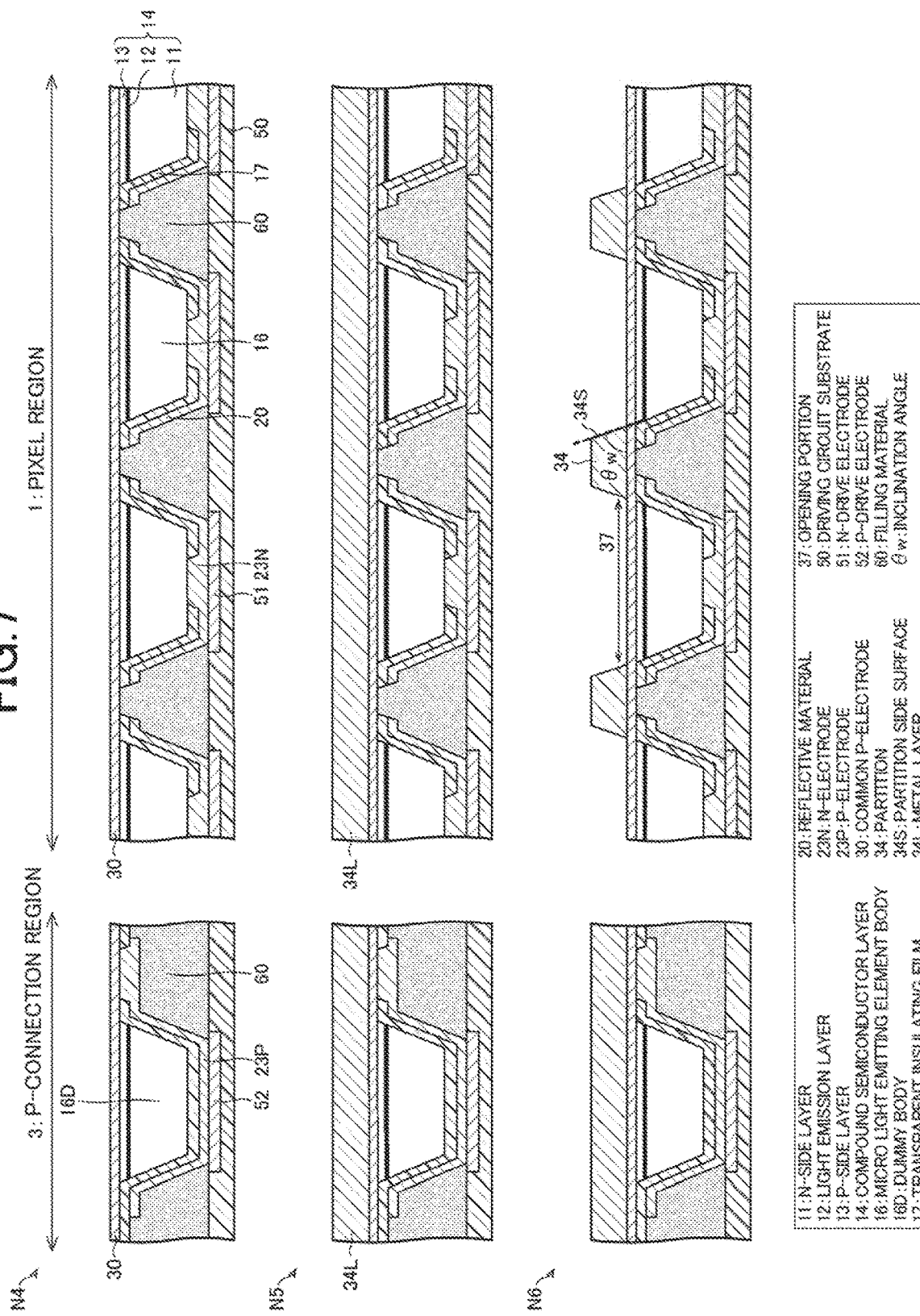
FIG. 7 is a schematic cross-sectional view of the manufacturing flow of the image display device, which is a view of the continuation of FIG. 6.
Figure 8:
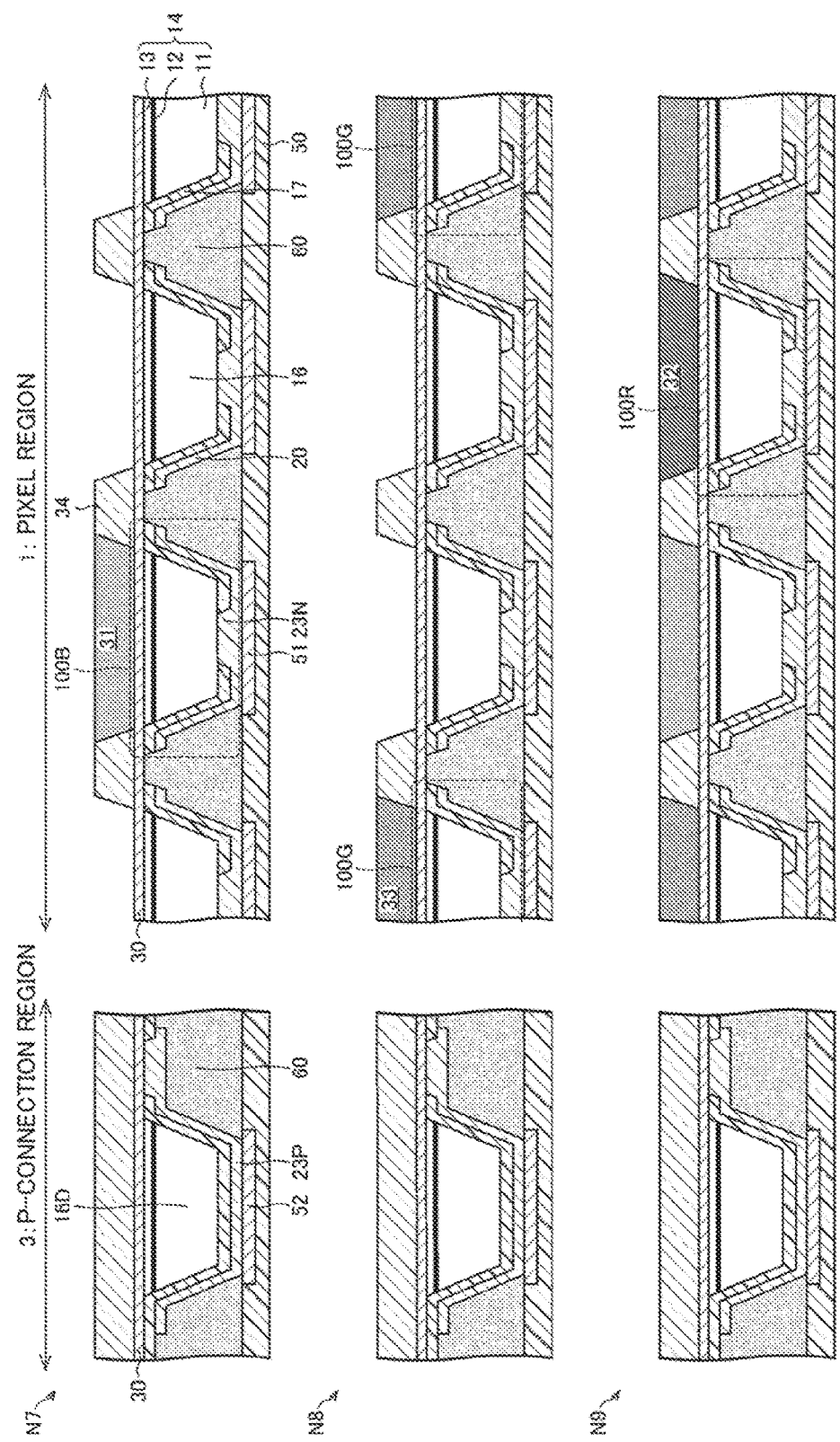
FIG. 8 is a schematic cross-sectional view of the manufacturing flow of the image display device, which is a view of the continuation of FIG. 7.

Next, a manufacturing flow of the image display device 200 will be described with reference to steps N1 to N9 of FIGS. 6 to 8. FIGS. 6 to 8 are schematic cross-sectional views of the manufacturing flow of the image display device 200 according to the first embodiment of the present disclosure. In the description of the manufacturing flow of the image display device 200, the LED processing substrate 10 side is the upper side, and the driving circuit substrate 50 side is the lower side.

First, the driving circuit substrate 50 shown in step N1 of FIG. 6 is manufactured. The driving circuit substrate 50 is formed, for example, on a single crystal silicon substrate (wafer) by a normal CMOS process. The micro light emitting element 100 and the driving circuit substrate 50 may be respectively in a wafer state, or the micro light emitting element 100 may be separated into individual pieces of the image display device 200. Both the micro light emitting element 100 and the driving circuit substrate 50 may be separated into individual pieces of the image display device 200.

As shown in FIG. 6, the driving circuit substrate 50 has, for example, a silicon substrate 71, a gate electrode 72, a contact plug 73, a via plug 74, an interlayer insulating film 75, and a diffusion layer 77, which is isolated by a trench isolation region 76, including a source 78 and a drain 79 on the silicon substrate 71. The contact plug 73 electrically connects between the gate electrode 72 and a first wiring layer and between the diffusion layer 77 and the first wiring layer. The via plug 74 electrically connects between the first wiring layer and a second wiring layer. Since the driving circuit substrate 50 can be manufactured by a known technique, a function and configuration thereof will not be described in detail. In the drawings after step N2 in FIG. 6

(steps N2 to N9 in FIGS. 6 to 8), only the N-drive electrode 51 and the P-drive electrode 52 are shown and other structures are omitted for the driving circuit substrate 50.

After the driving circuit substrate 50 is manufactured, the micro light emitting element 100 in the pixel region 1 and the dummy element 101 in the P-connection region 3 are bonded to the driving circuit substrate 50 as shown in step N2 of FIG. 6. At that time, the N-electrode 23N and the P-electrode 23P are precisely aligned to overlap the corresponding N-drive electrode 51 and P-drive electrode 52, respectively.

The two wafers are bonded together by plasma cleaning of the surface, activation by ion irradiation, heating, and pressurization according to the material of the bonding surface between the micro light emitting element 100 and the driving circuit substrate 50. In the subsequent steps, as shown in step N3 of FIG. 6, the LED processing substrate 10 is removed and the adhesive layer is also removed.

As shown in step N4 of FIG. 7, the common P-electrode 30 is deposited so as to cover exposed portions of the P-side layer 13, the transparent insulating film 17, the filling material 60, and the connection portion 40. For example, an ITO film is used as the common P-electrode 30. The common P-electrode 30 is preferably as thin as possible, preferably 10 nm to 300 nm, in order to reduce light absorption and avoid the optical crosstalk through the common P-electrode 30.

Next, a metal layer 34L is deposited as shown in step N5 of FIG. 7, and the metal layer 34L is etched by using the photolithography technique and the dry etching technique to form the partition 34 as shown in step N6 of FIG. 7. A portion where the metal layer 34L is removed becomes the opening portion 37, and light travels up and down through the opening portion 37. The partition 34 can also be formed by the lift-off method.

The inclination angle θw of the partition side surface 34S of the partition 34 can be controlled to various values by controlling a sidewall inclination angle of the photoresist and the anisotropy of dry etching in this step. In a region other than the pixel region 1, for example, as in the P-connection region 3 shown in step N6 of FIG. 7, most of the metal layer 34L may be left and used as a part of the common P-electrode 30. In the pixel region 1 as well, the metal layer 34L is vertically and horizontally (direction perpendicular to the paper surface and the left and right direction) connected and left as the partition 34. Therefore, it is possible to reduce the wiring resistance of the common P-electrode 30 even though the ITO film is thinned.

Next, as shown in step N7 of FIG. 8 to step N9 of FIG. 8, the transparent portion 31, the green wavelength conversion layer 33, and the red wavelength conversion layer 32 are sequentially formed on the upper portion of the micro light emitting element 100 partitioned by the partition 34. The formation order of each is not limited to the order shown in FIG. 8. The transparent portion 31, the red wavelength conversion layer 32, and the green wavelength conversion layer 33 may be respectively prepared as a positive resist material or a negative resist material, and pattern formation may be performed by the photolithography technique or by a printing method such as inkjet printing or screen printing. A nanoparticle or the like, such as a phosphor, a quantum dot, or a quantum rod, that absorbs the blue light which is the excitation light and down-converts the absorbed light into the red light or the green light may be adapted for the red wavelength conversion layer 32 and the green wavelength conversion layer 33.

Although not shown, after the transparent portion 31, the red wavelength conversion layer 32, and the green wavelength conversion layer 33 are formed, a silicon nitride film, a $SiO_2$ film, a silicone resin, or the like may be disposed, as a passivation material, on the surfaces of the transparent portion 31, the red wavelength conversion layer 32, and the green wavelength conversion layer 33. Accordingly, it is possible to block water and oxygen.

Light Emission Efficiency of Micro Light Emitting Element 100

The light emission efficiency of the micro light emitting element 100 formed as described above is evaluated. In the evaluated micro light emitting element 100, a disposition pitch is 10 μm, the shape is square, the inclination angle θe is 45°, the thickness of the P-side layer 13 is 200 nm, and the thickness of the N-side layer 11 after polishing is 3 μm. The size of the upper surface of the N-side layer 11 is 8 μm×8 μm. The thickness of the transparent portion 31 is 2.5 μm, the inclination angle θw of the partition side surface 34S is 70°, and the refractive index of a transparent resin is 1.6. The N-side layer 11 is mainly a GaN layer, the light emission layer 12 is a multiple quantum well layer made of InGaN and GaN, and a peak wavelength of light emitted from the light emission layer 12 is 450 nm. The P-side layer 13 is mainly a GaN layer. An aluminum film is disposed on the side surface 16S of the body 16 through a $SiO_2$ film of 400 nm, and an aluminum film is also disposed on the bottom surface. Both the reflective material 20 and the N-electrode 23N have an aluminum film on the body side. The material of the partition side surface 34S is also an aluminum film.

For comparison, evaluations are also made for a conventional micro light emitting element having a rectangular parallelepiped body 16 (corresponding to Q1 of FIG. 10) and a micro light emitting element having a structure in which the body shape is the same as that of the micro light emitting element 100 but the light emission layer 12 is disposed on the side opposite to the light emitting surface (corresponding to Q2 of FIG. 10). In each case, the size of the light emitting surface is set to 8 μm×8 μm, and the same compound semiconductor layer 14 is used. Except for the difference in shape and the position of the light emission layer 12, the constituent material and the forming process are the same. However, in the case of the rectangular parallelepiped shape, the separation trench 15 is processed so as not to be inclined as much as possible.

A transparent resin layer (transparent portion 31) is disposed on the upper surface of the micro light emitting element 100. Further, 10,000 micro light emitting elements 100 of 100 rows×100 columns are disposed, and the 10,000 micro light emitting elements 100 are simultaneously turned on to evaluate the total luminous flux intensity. An amount of current flowing through one micro light emitting element 100 is 5 μA. The same applies to the comparison structures.

FIG. 9 is a schematic cross-sectional view of a simulated structure (reverse truncated pyramid type structure) imitating the first embodiment of the present disclosure. FIG. 9 illustrates the body 16 of the micro light emitting element 100 and the transparent portion 31. As described above, the inclination angle θw is the angle formed by the partition side surface 34S and the upper surface of the common P-electrode 30, but the common P-electrode 30 is omitted in FIGS. 9 and 10. Thus, FIGS. 9 and 10 illustrate the inclination angle θw as an angle formed by the light emitting surface parallel to the common P-electrode 30 and the partition side surface 34S. The body 16 has a shape in which a truncated pyramid type is reversed, and the light emission layer 12 is disposed on the light emitting surface side.

The configuration Q1 and the configuration Q2 of FIG. 10 are schematic cross-sectional views of the structures simulated for comparison with FIG. 9. Specifically, the configuration Q1 of FIG. 10 is an example of the conventional micro light emitting element for comparison, in which the body 16 has the rectangular parallelepiped shape and the light emission layer 12 is on the bottom surface side. The configuration Q2 of FIG. 10 is a schematic diagram in a case where the shape of the body 16 is the same as that of FIG. 9 and the light emission layer 12 is on the bottom surface side. The micro light emitting element shown in FIG. 9 is compared with the micro light emitting elements shown in the configuration Q1 of FIG. 10 and the configuration Q2 of FIG. 10.

The measurement results are shown in Table 1 below.

TABLE 1

| Body shape | Reverse truncated pyramid type | Rectangular parallelepiped type | Reverse truncated pyramid type |
|---|---|---|---|
| Light emission layer position | Light emitting surface side | Driving circuit substrate side | Driving circuit substrate side |
| External quantum efficiency | 31% | 15% | 19% |
| Area ratio of light emission layer to light emitting surface | 90% | 100% | 6% |
| Estimated effective internal quantum efficiency | 74% | 79% | 40% |

As shown in Table 1, in the reverse truncated pyramid type structure (corresponding to FIG. 9) having the light emission layer 12 on the light emitting surface side, which is the present configuration, external quantum efficiency of about 2 times can be obtained as compared with a simple rectangular parallelepiped structure (corresponding to Q1 of FIG. 10). The external quantum efficiency of about 1.6 times can be obtained also for the reverse truncated pyramid type structure having the light emission layer 12 on the side opposite to the light emitting surface (corresponding to Q2 of FIG. 10).

Table 2 shows results of simulating the light extraction efficiency using a ray trace method. An estimated effective internal quantum efficiency in Table 1 is an estimated value calculated from the external quantum efficiency of Table 1 using the light extraction efficiency of Table 2. Values shown in Table 2 are simulation values.

TABLE 2

| | Structure | | |
|---|---|---|---|
| | FIG. 9 | Q1 of FIG. 10 | Q2 of FIG. 10 |
| Light emission layer position | Light emitting surface side | Driving circuit substrate side | Driving circuit substrate side |
| Light extraction efficiency | 42.1% | 18.9% | 47.8% |
| Side surface absorption | 34.2% | 27.7% | 27.3% |
| Bottom surface absorption | 3.4% | 40.9% | 5.6% |
| Internal absorption | 0.6% | 4.4% | 3.1% |
| Transparent portion side surface absorption | 18.2% | 7.5% | 15.2% |
| Average internal reflection number | 36.8 | 87.1 | 39.9 |
| Transparent portion average reflection number | 17.8 | 9.5 | 18.4 |

The light extraction efficiency represents a ratio of an amount of light emitted into the air through the transparent resin layer (transparent portion 31) disposed on the upper surface of the micro light emitting element 100, and side surface absorption represents a ratio of an amount of light absorbed by the reflective material 20 (refer to FIG. 1) of all side surfaces 16S of the body 16. Bottom surface absorption represents a ratio of an amount of light absorbed on the bottom surface side of the micro light emitting element 100, and an internal absorption represents a ratio of an amount of light absorbed in the body 16. Transparent portion side surface absorption represents a ratio of an amount of light absorbed in the partition side surface 34S of the transparent portion 31. An average internal reflection number represents an average value of reflection numbers inside the body 16 until the light emitted from the light emission layer 12 is emitted to the transparent portion 31 or is absorbed. A transparent portion average reflection number indicates an average reflection number until the light incident on the transparent portion 31 is emitted into the air, is absorbed by the partition side surface 34S, or returns to the body 16.

The tendency of the light extraction efficiency in Table 2 is in good agreement with the tendency of the external quantum efficiency in Table 1, and a difference in the external quantum efficiency is considered to be the main cause of a difference in the light extraction efficiency. Only light incident on the upper surface of the micro light emitting element 100 at an angle equal to or less than a critical total reflection angle is emitted from the upper surface of the micro light emitting element 100 to the outside. The critical total reflection angle is about 37° in a case of light incident on the transparent resin of the transparent portion 31 from the GaN constituting the body 16.

In the rectangular parallelepiped structure having the configuration Q1 of FIG. 10, the incident angle to the upper surface of the micro light emitting element 100 is constant regardless of the reflection number inside the body 16. Therefore, the light emitted in the horizontal direction from the light emission layer 12 is not emitted to the outside. On the contrary, in the truncated pyramid type structure having the configuration Q2 of FIGS. 9 and 10, the light emitted in the horizontal direction from the light emission layer 12 is reflected upward by the side surface 16S, is incident on the light emitting surface at an angle equal to or less than the critical total reflection angle, and is emitted to the outside.

Even in a case where the light is not emitted to the outside in an initial state when the light is emitted from the light emission layer 12, the incident angle of the light on the upper surface of the micro light emitting element 100 is changed each time the light emitted from the light emission layer 12 is reflected by the side surface 16S. Thus, the light emitted from the light emission layer 12 is repeatedly reflected inside the body 16 and then emitted to the outside. Therefore, in the truncated pyramid type structure having the configuration shown in FIG. 9 and Q2 of FIG. 10, it is possible to significantly improve the light extraction efficiency.

In the configuration of the configuration Q2 of FIG. 10, the external quantum efficiency is obviously low although the light extraction efficiency is higher than that of the present embodiment (configuration of FIG. 9). It is considered that this is because the area of the light emission layer 12 is reduced as compared with the configuration of FIG. 9 and thus the internal quantum efficiency is reduced. The current density increases due to the area reduction, and the internal quantum efficiency decreases due to the droop effect. When the body 16 is processed, a crystal defect may occur and the internal quantum efficiency may decrease. In the configuration of the present embodiment, it is possible to reduce such problems and realize high performance.

Influence of Transparent Insulating Film 17

Next, in order to examine the influence of the transparent insulating film 17, the dependence of the light extraction efficiency on the film thickness of the transparent insulating film 17 is simulated in the micro light emitting element 100 according to the first embodiment of the present disclosure. A result in a case where $SiO_2$ is used as the transparent insulating film 17 is shown in a graph R1 of FIG. 11. The graph R1 in FIG. 11 is a graph showing a simulation result of the film thickness dependence of the transparent insulating film 17 on the light extraction efficiency.

In the graph R1 of FIG. 11, the horizontal axis represents the film thickness of the transparent insulating film 17, and the vertical axis represents the percentage for each graph. In a case where there is no transparent insulating film 17, the light extraction efficiency (in-air emitting amount) is 32%. Therefore, the reverse truncated pyramid type structure not having the transparent insulating film 17 exhibits much higher light extraction efficiency than the rectangular parallelepiped structure (configuration Q1 of FIG. 10) having the transparent insulating film 17 shown in Table 1. The fact shows that the shape of the body 16 is very important.

Although the light extraction efficiency increases as the film thickness of the transparent insulating film 17 increases, there is a little change when the film thickness of the transparent insulating film 17 is 400 nm or more. Therefore, it is most preferable that the film thickness of the transparent insulating film 17 is 400 nm or more. However, a reduction rate of the light extraction efficiency is within 5% even when the film thickness is 75 nm or more. Therefore, the film thickness may be at least 75 nm or more.

From the above, it is considered that the effect of the transparent insulating film 17 is to improve the light extraction efficiency by improving the reflectance on the side surface 16S of the micro light emitting element 100. In the rectangular parallelepiped structure, the effect of the transparent insulating film 17 is very weak. It is considered that this is because the angle of incidence on the upper surface of the micro light emitting element does not change even though the reflectance on the side surface of the micro light emitting element having the rectangular parallelepiped structure is improved, the light totally reflected on the upper surface is totally reflected no matter how many times the reflection is repeated, and thus the light extraction efficiency is not improved. Therefore, in the present embodiment, it is important that the micro light emitting element 100 has the side surface 16S on which the incident angle to the upper surface thereof can be changed.

The graph R2 of FIG. 11 shows a result of examining the change in the light extraction efficiency with respect to the inclination angle θe of the side surface 16S using the simulation. The size of the upper surface, which is the light emitting surface, of the body 16 is 8 μm×8 μm, the thickness of the N-side layer 11 is 3 μm, and the thickness of the P-side layer 13 is 200 nm. The transparent portion 31 has the same conditions as in FIG. 9.

The horizontal axis of the graph R2 in FIG. 11 represents the inclination angle θe, and the vertical axis represents the percentage for each graph. As shown in the graph R2 of FIG. 11, a light emitting amount into the air increases as the inclination angle θe of the side surface 16S decreases from 90°, once peaks at around 55°, becomes a local minimum value at around 45°, and increases at 45° or less.

From the results, it is found that the micro light emitting element 100 according to the first embodiment of the present disclosure realizes the light emitting amount into the air of at least 25% or more when the inclination angle θe is 80° or less. The amount is about 1.3 times that of the rectangular parallelepiped structure shown in Table 2. Further, it is possible to realize the light emitting amount into the air of 40% or more when the inclination angle θe is 70° or less. Further, it is possible to realize the light emitting amount into the air of 45% or more between 50° and 65°. It is possible to realize the light emitting amount of 50% or more when the inclination angle θe is 40° or less.

In the micro light emitting element 100 according to the first embodiment of the present disclosure, the side surface 16S of the body 16 is tapered and is covered with the reflective material 20. Accordingly, it is possible to prevent the optical crosstalk between the micro light emitting elements 100 and significantly improve the light extraction efficiency. Further, it is possible to further improve the light extraction efficiency by disposing the transparent insulating film 17 between the side surface 16S and the reflective material 20.

Conversion Efficiency of Red Wavelength Conversion Layer 32

Next, the red sub-pixel 7 (refer to FIG. 2) will be considered. The red wavelength conversion layer 32 absorbs the blue light emitted from the micro light emitting element 100R, converts the wavelength into red light, and emits the red light to the outside. An absorption distribution of the blue light inside the red wavelength conversion layer 32 is simulated, the red light is generated according to the absorption distribution, and the light extraction efficiency of the generated red light emitted into the air is simulated. The conversion efficiency of converting the blue light into the red light (internal quantum efficiency of the conversion material) is highly material-dependent and thus is assumed to be 100% in the simulation. FIG. 12 shows a result of simulating the inclination angle θe dependence of the side surface 16S by replacing the transparent portion 31 of the configuration of FIG. 9 and the configuration Q1 and Q2 of FIG. 10 with the red wavelength conversion layer 32. The horizontal axis of FIG. 12 represents the inclination angle θe, and the vertical axis represents efficiency. It is set that the thickness of the red wavelength conversion layer 32 is 2.5 μm, the inclination angle θw of the partition side surface 34S is 70°, the complex refractive index for the blue light is 1.713+0.023i, and the complex refractive index for the red light is 1.671+0.0i. It is set that there is no absorption for the red light.

Table 3 shows simulation results relating to the structures of the configuration of FIG. 9 and the configuration Q1 and Q2 of FIG. 10.

TABLE 3

| | Structure | | |
| --- | --- | --- | --- |
| | FIG. 9 | Q1 of FIG. 10 | Q2 of FIG. 10 |
| Light emission layer position | Light emitting surface side | Driving circuit substrate side | Driving circuit substrate side |
| Blue light absorption efficiency (A) | 79.4% | 37.7% | 81.1% |
| Red light extraction efficiency (B) | 46.3% | 39.1% | 46.2% |
| Red light emission efficiency (C) | 36.7% | 14.7% | 37.5% |

TABLE 3-continued

| | Structure | | |
|---|---|---|---|
| | FIG. 9 | Q1 of FIG. 10 | Q2 of FIG. 10 |
| Blue light leakage efficiency (D) | 3.1% | 1.5% | 7.6% |
| Red light emission efficiency considering internal quantum efficiency (E) | 27.2% | 11.0% | 15.0% |

The blue light absorption efficiency (A) indicates a ratio of the blue light absorbed by the red wavelength conversion layer 32 out of the light generated in the body 16. The red light extraction efficiency (B) indicates a ratio of the red light emitted into the air out of the red light generated in the red wavelength conversion layer 32. The red light emission efficiency (C) is a product of (A) and (B), and represents efficiency with which the blue light is converted into the red light and emitted into the air. The blue light leakage efficiency (D) indicates a ratio of the blue light directly emitted into the air without being absorbed by the red wavelength conversion layer 32.

The blue light absorption efficiency (A) of FIG. 9 and Q2 of FIG. 10 is twice or more as large as that of Q1 of FIG. 10. That is, the blue light is efficiently taken into the red wavelength conversion layer 32 and absorbed due to the inclination of the side surface 16S of FIG. 9 and Q2 of FIG. 10. This point is similar to the case of the transparent portion 31. The red light extraction efficiency (B) of FIG. 9 and Q2 of FIG. 10 is also 15% or more as large as that of Q1 of FIG. 10. This indicates that the red light incident on the body 16, out of the red light generated in the red wavelength conversion layer 32, returns to the red wavelength conversion layer 32 with higher efficiency. That is, the red light is also taken into the red wavelength conversion layer 32 from the body 16 due to the inclination of the side surface 16S.

The blue light absorption efficiency (A) of FIG. 9 is slightly smaller than that of Q2 of FIG. 10. Therefore, the red light emission efficiency (C) is also slightly smaller. However, as seen in the case of the blue light, the reduction of the area of the light emission layer 12 causes the decrease in the internal quantum efficiency in Q2 of FIG. 10. Therefore, it is expected that the red light emission efficiency is actually higher in FIG. 9.

A product of the estimated effective internal quantum efficiency in Table 1 and the red light emission efficiency (C) is shown in the red light emission efficiency (E) in consideration of the internal quantum efficiency. As described above, 1.8 times the efficiency of Q2 of FIG. 10 can be achieved in FIG. 9. Further, FIG. 9 is also advantageous in that the blue light leakage efficiency (D) is smaller than that of Q2 of FIG. 10. The leakage of the blue light from the red sub-pixel 7 lowers the color purity of the red. Therefore, the leakage thereof is requested to be reduced by absorption by a color filter or reflection by a dielectric multilayer film. Such a blue light absorption or reflection unit has a side effect of reducing the emitting amount even for the red light. When the blue light leakage efficiency (D) is small, the side effects can be also reduced.

FIG. 12 shows a result of simulating the inclination angle $\theta e$ dependence of the side surface 16S in the structure of FIG. 9. As shown in FIG. 12, the blue light absorption efficiency (A) in the red wavelength conversion layer 32 increases as the inclination angle $\theta e$ decreases. This tendency is similar to the emission efficiency of blue light from the transparent portion 31 into the air. On the other hand, the red light extraction efficiency (B) has a peak at the inclination angle $\theta e$ of 55°. About two-thirds of the red light generated in the red wavelength conversion layer 32 is incident on the body 16. However, most of the red light incident on the body 16 is reflected inside the body 16 and returns to the red wavelength conversion layer 32. Since the efficiency of returning from the body 16 to the red wavelength conversion layer 32 has an angle dependence similar to that of the graph R2 in FIG. 11, it is presumed that a peak appears at around 55°. However, since the red light is incident from the red wavelength conversion layer 32 toward the body 16, the red light is reflected by the bottom portion of the body 16 and returns to the red wavelength conversion layer 32 even though the inclination angle $\theta e$ is large. Therefore, a probability of returning to the red wavelength conversion layer 32 from the body 16 is high and the inclination angle $\theta e$ dependence is weak.

As for the red light emission efficiency (C) of the red light into the air, the efficiency of 30% or more can be realized when the inclination angle $\theta e$ is 60° or less. Considering the emitting amount of the blue light in the graph R2 of FIG. 11 into the air, the inclination angle $\theta e$ is preferably 60° or less. The blue light leakage efficiency (D), which is the emitting amount of the blue light into the air, increases as the inclination angle $\theta e$ decreases. However, the increase in efficiency is about 5% or less, which is not a big problem. The color filter can also absorb the blue light.

Second Embodiment

Configuration of Image Display Device 200a

A second embodiment of the present disclosure will be described below with reference to FIGS. 13 to 19. For convenience of description, members having the same functions as those described in the first embodiment will be designated by the same reference numerals, and the description thereof will not be repeated. An image display device 200a according to the second embodiment is different from the image display device 200 according to the first embodiment in the shape of a body 16a of a micro light emitting element 100a, the configuration of a partition 34a, and the configuration of the common P-electrode 30a.

In the present embodiment, as shown in FIG. 13, a side surface 16Sa of the body 16a of the micro light emitting element 100a has a first side surface 16Sa1 and a second side surface 16Sa2. The first side surface 16Sa1 is located on a bottom portion side of the side surface 16Sa and forms a first inclination angle $\theta e1$ by the light emitting surface of the body 16a and the first side surface 16Sa1. The first inclination angle $\theta e1$ is 70° or less and preferably in a range of 30° to 60°.

The second side surface 16Sa2 is located on a light emitting direction side of the side surface 16Sa in the light emitting direction and forms a second inclination angle $\theta e2$ by the light emitting surface of the body 16a and the second side surface 16Sa2. The second inclination angle $\theta e2$ is 60° or more and preferably more than 70°. That is, the micro light emitting element 100a is configured such that the second inclination angle $\theta e2$ is larger than the first inclination angle $\theta e1$.

A thickness th1 of the body 16a at the first inclination angle $\theta e1$ portion is preferably 2 μm or less, and a thickness th2 of the body 16a at the second inclination angle $\theta e2$ portion is preferably 2 μm or more. It is difficult to process a thick compound semiconductor layer 14 on an inclined surface having the first inclination angle $\theta e1$. Therefore, in a case where the body 16a is relatively thick, the manufacturing is facilitated by providing the second inclination angle θe2 portion in this manner.

In the configuration of the present embodiment, the partition 34a is configured of a partition body 35, made of an inorganic material such as $SiO_2$ or SiN, or a resin material such as a photoresist material, and a partition reflection film 36 (second reflective material). The partition reflection film 36 is the high reflectance metal film or the like.

The points that the partition side surface 34S is formed of the high reflectance metal film, an opening portion 37a of the partition reflection film 36 is disposed inside the inner edge of the upper end portion of the reflective material 20, and the opening portion 37a covers the light emitting surface of the body 16a are the same as in the first embodiment.

When the metal layer 34L (refer to step N5 of FIG. 7 and step N6 of FIG. 7) is deposited and is processed into the partition 34 having the inclined surface by the photolithography method and the dry etching technique as in the first embodiment, the metal layer 34L having a height equal to or higher than the height of the partition 34 is requested to be deposited. Since the height of the partition 34 may be several m, a very thick metal layer 34L is requested. However, the surface of such a thick metal layer 34L has large unevenness, and precise alignment with an underlying layer is difficult. In the present disclosure, the bottom portion of the partition 34 is requested to cover the upper end portion of the reflective material 20, and the partition 34 is requested to be precisely aligned with the reflective material 20 as a pixel size of the image display device 200 becomes smaller. In the present embodiment, a central portion (partition body 35) of the partition 34a is formed of a transparent material that facilitates the precise alignment and has few surface unevenness, and a surface thereof is covered with the partition reflection film 36 to avoid the above problems.

In the present embodiment, the common P-electrode 30a is configured of the partition reflection film 36 and a transparent electrode 38. The partition reflection film 36 and the transparent electrode 38 are electrically connected. The partition reflection film 36, which is a good conductor, connects between the pixel region 1 and the P-connection region 3, between the pixels 5, and between the sub-pixels, and thus the wiring resistance of the common P-electrode 30a can be reduced. Since the transparent electrode 38 may mainly connect the P-side layer 13 of the body 16a and the partition reflection film 36, the transparent electrode 38 can be thinned. Therefore, it is possible to reduce the light absorption by the transparent electrode 38 and improve the light output.

Manufacturing Method of Micro Light Emitting Element 100a

Next, a manufacturing method of the micro light emitting element 100a will be described with reference to steps S1 to S5 of FIGS. 14 and 15. After step L1 of FIG. 3 to step L3 of FIG. 3 are performed, a separation trench 15a is formed as shown in step S1 of FIG. 14. The first side surface 16Sa1 having the first inclination angle θe1 is formed on the upper portion of the separation trench 15a, and the second side surface 16Sa2 having the second inclination angle θe2 is formed on the lower portion thereof. As described above, the side surface 16Sa includes the first side surface 16Sa1, and the second side surface 16Sa2 having different inclination angles θe. In the P-connection region 3, the P-contact trench 15Pa is formed and a dummy body 16Da is formed in the same cross-sectional shape as the micro light emitting element body 16a. However, the dummy body 16Da may be continuous in the direction perpendicular to the paper surface.

The transparent insulating film 17 is deposited as shown in step S2 of FIG. 14, and the N-contact hole 18N and the P-connection portion hole 18P are formed as shown in step S3 of FIG. 14. The metal layer 20L (metal layer for reflective material) is deposited as shown in step S4 of FIG. 15, and the metal layer 20L is processed into the N-electrode 23N, the reflective material 20, P-electrode 23P, and the like as shown in step S5 of FIG. 15. At this time, as shown in step S5 of FIG. 15, the metal layer 20L is processed so as to cover the cut surface of the transparent insulating film 17 at a bottom portion of the separation trench 15a. Accordingly, the light leakage through the transparent insulating film 17 can be prevented by the metal layer 20L. Therefore, it is possible to prevent the optical crosstalk between the micro light emitting elements 100a.

Manufacturing Method of Image Display Device 200a

Next, a manufacturing method of the image display device 200a will be described with reference to steps T1 to T8 of FIGS. 16 to 18. In the configuration of the present embodiment, unlike the first embodiment, a filling material 60a is formed after the micro light emitting element 100a is bonded to the driving circuit substrate 50. Step S1 of FIG. 16 and step S2 of FIG. 16 are respectively the same as step N2 of FIG. 6 and step N3 of FIG. 6. Next, the filling material 60a is formed as shown in step T3 of FIG. 16. The filling material 60a is an insulating material and may be a transparent resin. This is because the cut surface of the transparent insulating film 17 is covered with the metal layer 20L and thus the light leakage is less likely to occur through the filling material 60a.

Next, the partition body 35 is formed between the sub-pixels in the pixel region 1 as shown in step T4 of FIG. 17. The partition body 35 may be formed of, for example, a negative resist. Alternatively, a thin film such as $SiO_2$ may be deposited and processed by the photolithography technique and the dry etching technique. A sidewall of the partition body 35 is preferably controlled to have a predetermined inclination angle θw. The inclination angle θw in the second and third embodiments is an angle formed by an extension line of the light emitting surface of the body 16a of each micro light emitting element 100a and the partition side surface 34S. The bottom portion of the partition body 35 is requested to cover the upper end portion of the reflective material 20. The bottom surface side of the partition body 35 may be formed of a light shielding material. Accordingly, it is possible to prevent the light leakage through the partition body 35.

The partition reflection film 36 is deposited s shown in step T5 of FIG. 17. At this time, in the P-connection region 3, the partition reflection film 36 and the P-electrode 23P are connected at the connection portion 40. As in the case of the reflective material 20, the partition reflection film 36 is preferably a metal thin film having high reflectivity for the visible light or a material having equivalent characteristics.

Next, as shown in step T6 of FIG. 17, the opening portion 37a is provided in the partition reflection film 36 in a portion overlapping the light emitting surface of the body 16a in plan view. The opening portion 37a can be formed by the photolithography technique and the wet or dry etching technique. The opening portion 37a is preferably inside the micro light emitting element 100a from the upper end portion of the reflective material 20 in plan view. In order to facilitate the round trip of the light between the micro light emitting element 100a and the transparent portion 31, the red wavelength conversion layer 32, and the green wavelength conversion layer 33, it is preferable that the opening portion 37a occupy as wide a range as possible in a range of the light emitting surface of the micro light emitting element 100a. In particular, the opening portion 37a preferably overlaps the entire light emitting surface of the body 16a.

Next, the transparent electrode 38 is deposited as shown in step T7 of FIG. 18. The transparent electrode 38 is made of the same material as the common P-electrode 30 in the first embodiment. The subsequent steps are the same as those in the first embodiment, and the transparent portion 31, the red wavelength conversion layer 32, and the green wavelength conversion layer 33 are sequentially formed as shown in step S8 of FIG. 18. In the cross-sectional view of step T6 in FIG. 17, an end portion of the partition reflection film 36 covers a part of the light emitting surface of the body 16a. In such a case, the transparent electrode 38 can be omitted by electrically connecting the partition reflection film 36 and the P-side layer 13.

Table 4 shows a result of simulating the light extraction efficiency for the configuration shown in FIG. 19 corresponding to the configuration of the present embodiment. In the configuration shown in FIG. 19, the light extraction efficiency equal to or higher than that of the configuration of FIG. 9 corresponding to the first embodiment is also obtained. In the configuration of the present embodiment, the area of the light emission layer 12 can be made larger than that of the first embodiment since the inclination angle near the side surface of the light emission layer 12 is large. Although the second inclination angle $\theta e2$ is larger than 70° in the above description, the second inclination angle $\theta e2$ is set to 70° in FIG. 19 to simplify the description.

TABLE 4

| | Shape | |
|---|---|---|
| | FIG. 19 | FIG. 9 |
| Light emission layer position | Light emitting surface side | Light emitting surface side |
| Light extraction efficiency | 45.6% | 42.1% |
| Side surface absorption | 28.5% | 34.2% |
| Bottom surface absorption | 9.4% | 3.4% |
| Internal absorption | 0.4% | 0.6% |
| Transparent portion side surface absorption | 15.3% | 18.2% |
| Average internal reflection number | 25.3 | 36.8 |
| Transparent portion average reflection number | 20.7 | 17.8 |

As described above, it is also possible to realize the same effect as that of the first embodiment in the configuration of the image display device 200a.

Third Embodiment

Configuration of Image Display Device 200b

A third embodiment of the present disclosure will be described below with reference to FIG. 20. For convenience of description, members having the same functions as the members described in the above embodiments are designated by the same reference numerals, and the description thereof will not be repeated. An image display device 200b according to the third embodiment has a configuration similar to that of the second embodiment, but the shape of a body 16b is different.

In the second embodiment, the inclination angle is $\theta e1 < \theta e2$, and the first side surface 16Sa1 inclined at the small first inclination angle $\theta e1$ is disposed on the side opposite to the light emitting surface side with respect to the second side surface 16Sa2 inclined at the large second inclination angle $\theta e2$. On the contrary, in the present embodiment, a first side surface 16Sb11 inclined at a small first inclination angle $\theta e11$ is disposed on the light emitting surface side with respect to a second side surface 16Sb12 inclined at a large second inclination angle $\theta e12$.

More specifically, the first side surface 16Sb11 is located on the light emitting direction side of the side surface 16Sb, and the light emitting surface of the body 16b and the first side surface 16Sb11 form the first inclination angle $\theta e11$. The first inclination angle $\theta e11$ is 70° or less, preferably in a range of 30° to 60°. The second side surface 16Sb12 is located on the bottom portion side of the side surface 16Sb, and the light emitting surface of the body 16b and the second side surface 16Sa12 form the second inclination angle $\theta e12$. The second inclination angle $\theta e12$ is 60° or more, and preferably more than 70°.

A manufacturing flow of the present embodiment is the same as the manufacturing flow of the second embodiment, and the only difference is that the shape of the separation trench 15a is changed in S1 of FIG. 14. That is, in the second embodiment, the side surface 16Sa of the body 16a is processed so as to have the small first inclination angle $\theta e1$ at the bottom portion (driving circuit substrate 50 side) and the large second inclination angles $\theta e2$ at the upper portion (light emitting direction side), as shown in FIG. 13. On the contrary, in the present embodiment, the side surface 16Sb of the body 16b is processed so as to have the large second inclination angles $\theta e12$ at the bottom portion (driving circuit substrate 50 side) and the small first inclination angle $\theta e11$ at the upper portion (light emitting direction side), as shown in FIG. 20.

In the present embodiment, the first side surface 16Sb1 having the small first inclination angle $\theta e11$ of 30° to 60° is disposed near the light emission layer 12 on the side surface 16Sb, and thus it is possible to further improve the light extraction efficiency. Table 5 shows a result of simulating the light extraction efficiency in the present embodiment. In the simulation of the configuration shown in FIG. 21 corresponding to the present embodiment, the light extraction efficiency higher than that of FIG. 19 corresponding to the second embodiment by 20% is obtained.

TABLE 5

| | Shape | |
|---|---|---|
| | FIG. 21 | FIG. 19 |
| Light emission layer position | Light emitting surface side | Light emitting surface side |
| Light extraction efficiency | 55.0% | 45.6% |
| Side surface absorption | 19.1% | 28.5% |
| Bottom surface absorption | 8.5% | 9.4% |
| Internal absorption | 0.3% | 0.4% |
| Transparent portion side surface absorption | 16.2% | 15.3% |

TABLE 5-continued

| | Shape | |
| --- | --- | --- |
| | FIG. 21 | FIG. 19 |
| Average internal reflection number | 21.5 | 25.3 |
| Transparent portion average reflection number | 20.6 | 20.7 |

In Table 5, the average reflection number within the body 16b decreases and the light absorption efficiency on the side surface 16Sb of the body 16b is significantly reduced in the configuration of the third embodiment shown in FIG. 21, as compared with the configuration of the second embodiment shown in FIG. 19. This indicates that the configuration of the third embodiment efficiently emits the light to the transparent portion 31. The reason can be described as follows. That is, since the light emission layer 12 emits the light isotropically, most of the light is emitted in a direction parallel to the light emission layer 12. The first side surface 16Sb11 having the first inclination angle θe11 smaller than the second inclination angle θe12 of the second side surface 16Sb12 is disposed on the light emitting surface side, and thus the light traveling in the horizontal direction can be reflected toward the light emitting surface direction. In other words, the inclination angle on the light emitting surface direction side is reduced on the side surface 16Sb, and thus the light can be introduced into the transparent portion 31 more efficiently. As a result, the light emitting amount into the air increases.

As in the case of FIG. 19, the second inclination angle θe12 is set to 70° in FIG. 21 to simplify the description.

As described above, it is also possible to realize the same effect as that of the first embodiment also in the configuration of the image display device 200b.

Fourth Embodiment

A fourth embodiment of the present disclosure will be described below with reference to FIGS. 22, 23, steps U1 to U9 of FIGS. 24 to 26, and steps V1 to V4 of FIG. 27. For convenience of description, members having the same functions as the members described in the above embodiments are designated by the same reference numerals, and the description thereof will not be repeated.

In the above embodiments, the light is emitted to the side opposite to the driving circuit substrate 50. On the contrary, in the present embodiment, the light is emitted to a driving circuit substrate 50c side. The driving circuit substrate 50c is a transparent substrate. In the embodiments described so far, the wavelength conversion is performed with the blue light as the excitation light to generate the red light and the green light. On the contrary, in the present embodiment, a compound semiconductor, such as InGaAlP or europium (Eu)-doped gallium nitride (GaN:Eu), that emits the red light is used for the red light emission and a compound semiconductor, such as InGaAlN, that emits the green light is used for the green light emission. A micro light emitting element 100c according to present embodiment is individually mounted on the driving circuit substrate 50c by a so-called Pick & Place method.

Configuration of Image Display Device 200c

FIG. 22 shows a schematic plan view of a pixel 5c constituting an image display device 200c. FIG. 23 shows a schematic cross-sectional view of a mounting portion of the micro light emitting element 100c. FIG. 23 is a cross-sectional view of a portion B-B in FIG. 22. A micro light emitting element 100Rc, a micro light emitting element 100Gc, and a micro light emitting element 100Bc are mounted on the pixel 5c, and respectively emit the red light, the green light, and the blue light.

A predetermined current is supplied from a pixel driving circuit 2 to the micro light emitting element 100c. The pixel driving circuit 2 may be a circuit configured of a thin film transistor formed on the driving circuit substrate 50c, or may be a microchip mounted as in the case of the micro light emitting element 100c. In the pixel 5c, a power supply line Vcc, a ground line GND, a column signal line CS-B, a column signal line CS-R, a column signal line CS-G, a row selection line RS, and the like are wired. An N-electrode 23Nc of the micro light emitting element 100c is connected to the GND line through an N-drive electrode 51c. A P-electrode 23Pc is connected to the pixel driving circuit 2 through a P-drive electrode 52c. Wiring lines connecting the power supply line Vcc, the column signal line CS-B, the column signal line CS-R, and the column signal line CS-G to the pixel driving circuit 2, and the row selection line RS are first-layer wiring lines. Other wiring lines are second-layer wiring lines above or under the first-layer wiring lines.

As shown in FIG. 23, the micro light emitting element 100c is adhered onto the driving circuit substrate 50c made of a transparent substrate with the light emitting surface facing the driving circuit substrate 50c. The light emission layer 12 is disposed on the light emitting surface side, and a side surface 16Sc of a body 16c is tapered to open toward a light emitting side. The inclination of the side surface 16Sc is similar to that of the other embodiments. The side surface 16Sc is covered with the transparent insulating film 17, and the outside thereof is further covered with the N-electrode 23Nc and the P-electrode 23Pc formed of the high reflectance metal film. In the configuration of the present embodiment, a region isolating the N-electrode 23Nc and the P-electrode 23Pc is not covered with the high reflectance metal film, but is covered with the P-drive electrode 52c. In plan view shown in FIG. 22, the body 16c is entirely covered by the N-electrode 23Nc, the reflective material 20, and the P-drive electrode 52c. Even though the reflection characteristics of the P-drive electrode 52c are not as good as the N-electrode 23Nc or the P-electrode 23Pc, an area covered with the P-drive electrode 52c is small compared with the entire side surface 16Sc of the micro light emitting element 100c. Therefore, it is possible to sufficiently obtain the effect of improving the light output. It is possible to prevent the light leakage from the micro light emitting element 100c to a back surface side (side opposite to the light emitting direction) by covering the region isolating the N-electrode 23Nc and the P-electrode 23Pc with the P-drive electrode 52c.

A difference between the micro light emitting element 100c and the micro light emitting element 100 of the other embodiments is that the micro light emitting element 100c has a P-electrode connection portion 42. The P-electrode connection portion 42 is a wiring line for connecting the transparent electrode 41 and the P-drive electrode 52c. As shown in FIG. 23, the P-electrode connection portion 42 is in contact with a surface of the transparent electrode 41 on the light emitting direction side, extends outward from the body 16c, and is connected to the P-electrode 23Pc in this extended portion.

Manufacturing Method of Micro Light Emitting Element 100c

Next, a manufacturing method of the micro light emitting element 100c will be described using steps U1 to U9 of FIGS. 24 to 26. As shown in step U1 of FIG. 24, as in the other embodiments, the compound semiconductor layer 14 is formed on the growth substrate 9, and then a transparent electrode layer 41L and a metal electrode layer 42L are deposited. The transparent electrode layer 41L is electrically connected to the P-side layer 13. As shown in step U2 of FIG. 24, the metal electrode layer 42L is removed while the P-electrode connection portion 42 is left. The P-electrode connection portion 42 is a wiring line for connecting the transparent electrode layer 41L and the P-electrode 23Pc. In other words, the P-electrode connection portion 42 is a part of the wiring line connecting the transparent electrode layer 41L and the P-drive electrode 52c.

Next, the structure formed on the growth substrate 9 is bonded onto the LED processing substrate 10 through the adhesive layer 19 as shown in step U3 of FIG. 24, and the growth substrate 9 is peeled off as shown in step U4 of FIG. 25. The separation trench 15 is formed, as shown in step U5 of FIG. 25. A part of the P-electrode connection portion 42 is exposed at a bottom portion of the separation trench 15. At this time, an area of the P-electrode connection portion 42 that covers the light emitting surface of the body 16c is requested to be the minimum as requested so as not to interfere with the light emitting. The separation trench 15 is requested to be processed such that the side surface 16Sc of the body 16c is appropriately inclined. The transparent electrode layer 41L is preferably to be thin such that the transparent electrode layer 41L does not remain on the bottom portion of the separation trench 15. Accordingly, the transparent electrode layer 41L remains only in a portion in contact with the P-side layer 13 and becomes the transparent electrode 41.

Next, the transparent insulating film 17 is deposited, as shown in step U6 of FIG. 25. Subsequently, the N-contact hole 18N is opened in the transparent insulating film 17 of the body 16c to expose the N-side layer 11, as shown in step U7 of FIG. 26. A P-contact hole 18Pc is opened on the P-electrode connection portion 42 at the bottom portion of the separation trench 15 to expose the P-electrode connection portion 42.

Subsequently, the metal layer 20L (high reflectivity metal layer) serving as the reflective material is deposited, as shown in step U8 of FIG. 26. At this time, the metal layer 20L is connected to the N-side layer 11 through the N-contact hole 18N and is connected to the P-electrode connection portion 42 through the P-contact hole 18Pc. As shown in step U9 of FIG. 26, the metal layer 20L is processed into the N-electrode 23Nc, the P-electrode 23Pc, and the reflective material 20. Accordingly, the micro light emitting element 100c is completed. In this configuration, the P-electrode 23Pc connected to the P-electrode connection portion 42 is formed at the same time as the N-electrode 23Nc, but the P-electrode 23Pc may be omitted. In a case where the P-electrode 23Pc is omitted, the P-electrode connection portion 42 is directly connected to the P-drive electrode 52c, and thus the P-electrode connection portion 42 also serves as the P-electrode 23Pc. As shown in FIG. 22, the body 16c is entirely covered with the N-electrode 23Nc, the reflective material 20, and the P-drive electrode 52c in plan view. Therefore, the light leakage to the back surface side does not occur.

Manufacturing Method of Image Display Device 200c

Since the formation of the signal lines on the driving circuit substrate 50c and the formation of the pixel driving circuit 2 are known, the description thereof will be omitted. Only a mounting method of the micro light emitting element 100c will be described. In the configuration of the present embodiment, a case will be described in which the first-layer wiring line of the driving circuit substrate 50c is formed, then the micro light emitting element 100c is mounted by the Pick & Place method, and an interlayer insulating film 62 and the second-layer wiring line are formed after the mounting of the micro light emitting element 100c. However, the manufacturing method is not limited thereto.

As shown in step V1 of FIG. 27, the micro light emitting element 100c is mounted and fixed on the driving circuit substrate 50c through a transparent adhesive layer 61. Next, the interlayer insulating film 62 is formed, as shown in step V2 of FIG. 27. The adhesive layer 61 is insulative. As shown in step V3 of FIG. 27, an N-contact hole 63N and a P-contact hole 63P are respectively opened on the N-electrode 23Nc and the P-electrode 23Pc to expose surfaces of the N-electrode 23Nc and the P-electrode 23Pc. The N-contact hole 63N and the P-contact hole 63P may be formed at the same time with a via hole that connects the first-layer wiring line and the second-layer wiring line of the driving circuit substrate 50c, or may be formed separately. As shown in step V4 of FIG. 27, the second-layer wiring line is deposited and processed into an N-drive electrode 51c and a P-drive electrode 52c.

Accordingly, the P-side layer 13 is electrically connected to the P-drive electrode 52c through the transparent electrode 41, the P-electrode connection portion 42, and the P-electrode 23Pc. The N-side layer 11 is electrically connected to the N-drive electrode 51c through the N-electrode 23Nc.

As described above, the micro light emitting element 100c is mounted on the transparent driving circuit substrate 50c, and thus it is possible to provide a highly efficient display element through the driving circuit substrate 50c. It is possible to realize the same effect as that of the first embodiment also in the configuration of the present embodiment.

Modification Example

Modification examples of the above embodiments are shown in configurations W1 to W6 of FIGS. 28 and 29. A difference between the modification examples is in the micro light emitting element, and only the micro light emitting element portion is illustrated in FIGS. 28 and 29. Even though the micro light emitting element 100 to the micro light emitting element 100c shown in the first to fourth embodiments are replaced with some different micro light emitting elements as shown in the configurations W1 to W6 of FIGS. 28 and 29, it is possible to obtain the same effect as that of the first embodiment. In FIGS. 28 and 29, a transparent electrode 38 is disposed on the P-side layer as the common P-electrode.

In a micro light emitting element 100d shown in the configuration W1 of FIG. 28, a side surface 16Sd of a body 16d is a curved surface. This is a case where the inclination angle of the side surface 16Sd continuously changes and corresponds to a case where the number of surfaces having different inclination angles is increased in the second embodiment in which the side surface 16Sa includes the two surfaces having the different inclination angles. In the configuration of the present embodiment, it is also possible to obtain the same effect as that of the second embodiment.

A micro light emitting element 100e shown in the configuration W2 of FIG. 28 corresponds to the case where a dielectric multilayer film 17e is used as the transparent insulating film 17 in the first embodiment. It is possible to reduce the light absorption on a side surface 16Se and further enhance the light extraction effect by using a dielectric multilayer film having a distributed Bragg reflector (DBR) function to enhance the reflectance on a side surface 16Se. In this case, the dielectric multilayer film 17e preferably has a high reflectance for the light emitted from the micro light emitting element 100e. Further, the dielectric multilayer film 17e preferably has a high reflectance for the light generated by the wavelength conversion.

The configuration W2 of FIG. 28 shows two N-contact holes 18Ne unlike FIG. 1, but the number of N-contact holes 18Ne may be one or more. When an area of the N-contact hole 18 is smaller than the bottom surface of the body 16e (surface on the driving circuit substrate 50 side), the light absorption is small and the light extraction efficiency is high. Therefore, it is important to reduce the total area of the N-contact holes 18, and it may be better to provide a plurality of small holes such as the N-contact holes 18Ne. For the N-contact hole having a small diameter and deep, the metal layer 20L (refer to FIG. 5) may be deposited after a metal plug is filled.

A micro light emitting element 100f shown in the configuration W3 of FIG. 28 is different from that of the first embodiment in that a compound semiconductor multilayer film 43 is included in an N-side layer 1ie. The compound semiconductor multilayer film 43 has the DBR function. For example, in the case of the compound semiconductor layer 14 shown in the micro light emitting element 100f, a plurality of AlGaN layers and InGaN layers are stacked to increase the reflectance for the visible light. As described above, with the high reflectance for the light in the visible light range, it is possible to reduce the light absorption on the bottom surface of a body 16f and further enhance the light extraction efficiency.

A micro light emitting element 100g shown in the configuration W4 of FIG. 29 is different from that of the first embodiment in that a compound semiconductor multilayer film 44 is included in a P-side layer 13g. The compound semiconductor multilayer film 44 has the DBR function. For example, in the case of the compound semiconductor layer 14 shown in the micro light emitting element 100g, a plurality of AlGaN layers and InGaN layers are stacked to have high transmissivity for the emission wavelength of the micro light emitting element 100g and have the high reflectance for the light whose wavelength is converted. With the disposition of the film having such characteristics on the light emitting surface side, it is possible to prevent the light whose wavelength is converted from being incident on a body 16g, being absorbed by a side surface 16Sg and a bottom surface of the body 16g, and thus reducing the light output.

A micro light emitting element 100h shown in the configuration W5 in FIG. 29 is different from the previous embodiments in that a reflective material 20h and an N-electrode 23Nh are isolated. In the first to third embodiments, since the reflective material 20 and the N-electrode 23N are integrated, it is requested to prevent the reflective material 20 and the common P-electrode 30 from being electrically connected. In the micro light emitting element 100h, the reflective material 20h and the N-electrode 23Nh are isolated, and thus the reflective material 20h can be electrically contacted with the common P-electrode 30 and used as a part of the wiring line.

In the micro light emitting element 100h, an N-contact electrode 45 is disposed on a bottom surface of a body 16h to connect the N-contact electrode 45 and the N-electrode 23Nh, but the N-contact electrode 45 may be omitted. The high reflectance metal film is preferably disposed on a surface of the N-contact electrode 45 on the body 16h side. In a case where the N-contact electrode 45 is omitted, the high reflectance metal film is preferably disposed on the surface of the N-electrode 23Nh on the body 16h side. A side surface 16Sh of the body 16h is covered with the reflective material 20h and the bottom surface thereof is covered with the N-electrode 23Nh, and thus it is possible to suppress the light leakage from the body 16h to the outside.

A micro light emitting element 100i shown in the configuration W6 in FIG. 29 is different from that of the first embodiment in that a P-electrode 23Pi is provided in the pixel region 1. A P-electrode 23Pi (third electrode) is provided on the outer peripheral portion of the micro light emitting element 100i, and the P-electrode 23Pi is connected to the common P-electrode 30 on the light emitting surface side. With the micro light emitting element 100i, it is not requested to provide a region for connecting the common P-electrode 30 and the P-drive electrode 52 outside the pixel region 1, by providing the P-drive electrode 52 in the pixel region 1 of the driving circuit substrate 50 to connect to the P-electrode 23Pi.

When the high reflectance metal film is disposed on a surface of the P-electrode 23Pi on a body 16i side, it is not requested to extend an N-electrode 23Ni to the light emitting surface side. In this case, the reflective material 20i is configured of two types of members of the extended portion of the N-electrode 23Ni and the P-electrode 23Pi. This point also differs from the first embodiment.

Summary

A micro light emitting element according to a first aspect of the present disclosure includes a body including a compound semiconductor layer in which a first conductive layer, a light emission layer, and a second conductive layer having a conductive type opposite to that of the first conductive layer are stacked in order from a light emitting surface side, a first electrode including a transparent electrode on the light emitting surface side, a second electrode including a metal film on a side opposite to the light emitting surface, and a first reflective material covering a side surface of the body. The light emission layer is disposed on the light emitting surface side of the body. The side surface of the body is tapered to open in a light emitting direction. A surface of the second electrode and a surface of the first reflective material on the body side are reflective surfaces that reflect visible light.

According to the above configuration, in the body including the compound semiconductor layer in which the first conductive layer, the light emission layer, and the second conductive layer are stacked, the light emission layer is disposed on the light emitting surface side in the body in the micro light emitting element. Accordingly, in the micro light emitting element in which the side surface of the body is tapered to open, it is possible to increase the area of the light emitting surface of the light emission layer as compared with the case where the light emission layer is disposed on the side opposite to the light emitting surface side of the body. As a result, it is possible to improve the internal quantum efficiency of the micro light emitting element and the external quantum efficiency.

The side surface of the body is tapered to open in the light emitting direction. Therefore, the light traveling in the direction parallel to the horizontal surface inside the micro light emitting element can be reflected by the side surface of the body toward the light emitting surface. As a result, it is possible to improve the light extraction efficiency of the micro light emitting element.

In the micro light emitting element, the surface of the second electrode and the surface of the first reflective material on the body side are the reflective surfaces that reflect the visible light. Accordingly, it is possible to prevent the light emitted from the micro light emitting element from leaking to the outside of the micro light emitting element. As a result, it is possible to prevent the optical crosstalk.

As described above, according to the micro light emitting element, it is possible to prevent the optical crosstalk between the adjacent micro light emitting elements and improve the light extraction efficiency of the micro light emitting element to improve the light emission efficiency of the micro light emitting element. It is possible to prevent a decrease in contrast and a decrease in color purity by preventing the optical crosstalk between the adjacent micro light emitting elements. Further, it is possible to reduce power consumption by improving the light emission efficiency of the micro light emitting element.

In the micro light emitting element according to a second aspect of the present disclosure, the reflective surface may be made of a metal material that reflects the visible light in the first aspect.

According to the above configuration, it is possible to more reliably prevent the light emitted from the micro light emitting element from leaking to the outside of the micro light emitting element.

The micro light emitting element according to a third aspect of the present disclosure may further include a transparent insulating film between the side surface of the body and the first reflective material in the first or second aspect.

According to the above configuration, in the micro light emitting element, it is possible to improve the reflectance of the light emitted from the micro light emitting element by the transparent insulating film provided between the side surface of the body and the first reflective material. Therefore, it is possible to further improve the light extraction efficiency.

In the micro light emitting element according to a fourth aspect of the present disclosure, the transparent insulating film may have a thickness of 75 nm or more in the third aspect.

According to the above configuration, it is possible to efficiently improve the light extraction efficiency by the transparent insulating film.

In the micro light emitting element according to a fifth aspect of the present disclosure, the transparent insulating film may have a thickness of 400 nm or more in the third aspect.

According to the above configuration, it is possible to optimally improve the light extraction efficiency by the transparent insulating film.

In the micro light emitting element according to a sixth aspect of the present disclosure, the second electrode and the first reflective material may be made of the same material in the first to fifth aspects.

According to the above configuration, since the second electrode and the first reflective material can be simultaneously formed in one step, it is possible to shorten the manufacturing flow of the micro light emitting element.

In the micro light emitting element according to a seventh aspect of the present disclosure, the side surface of the body may have the inclination angle of 70° or less in the first to sixth aspects.

According to the above configuration, it is possible to optimally improve the light extraction efficiency.

In the micro light emitting element according to an eighth aspect of the present disclosure, the side surface of the body may have a constant inclination angle in the seventh aspect.

According to the above configuration, it is possible to simplify the step of forming the separation trench for separating the micro light emitting elements after the compound semiconductor layer is formed, as compared with the case where the side surface of the body has the plurality of side surfaces having the different inclination angles.

In the micro light emitting element according to a ninth aspect of the present disclosure, the side surface of the body may have at least a first side surface having an inclination angle of 70° or less and a second side surface having an inclination angle of more than 70° in the seventh aspect.

According to the above configuration, the side surface of the body has the plurality of side surfaces having the different inclination angles. Therefore, it is possible to improve the light extraction efficiency by adjusting the reflection of the light on the side surface of the body while adjusting the area of the light emission layer.

In the micro light emitting element according to a tenth aspect of the present disclosure, the second side surface may be disposed on the light emitting surface side of the first side surface in the ninth aspect.

According to the above configuration, since the inclination angle near the side surface of the light emission layer can be increased, it is possible to increase the area of the light emission layer.

In the micro light emitting element according to an eleventh aspect of the present disclosure, the first side surface may be disposed on the light emitting surface side of the second side surface in the ninth aspect.

According to the above configuration, it is possible to further improve the light extraction efficiency by reducing the inclination angle near the side surface of the light emission layer.

An image display device according to a twelfth aspect of the present disclosure includes the micro light emitting elements according to the first to eleventh aspects, and includes pixels disposed in an array, a driving circuit substrate including a driving circuit for supplying a current to the micro light emitting element to emit light, and a wavelength conversion layer that absorbs excitation light emitted from the micro light emitting element, converts the absorbed light into long-wavelength light with a wavelength longer than the excitation light, and emits the converted light to the outside. The wavelength conversion layer is disposed on the first electrode and emits the long-wavelength light to a side opposite to the driving circuit substrate, and is surrounded by a partition having a side surface that is tapered to open in a light emitting direction and reflects the long-wavelength light.

According to the above configuration, in the image display device, the wavelength conversion layer that converts the excitation light emitted from the micro light emitting element into the light having the longer wavelength than the excitation light and emits the converted light to the outside is surrounded by the partition having the side surface that is tapered to open in the light emitting direction and reflects the long-wavelength light. Accordingly, it is possible to prevent the light from leaking from the wavelength conversion layer to the partition and to reflect the long-wavelength light on the side surface of the partition. Therefore, it is possible to reduce loss of the light emitted to the outside of the wavelength conversion layer. As a result, it is possible to form the image display device that exhibits the effect of the first aspect and can reduce the loss of the light emitted to the outside of the image display device.

An image display device according to a thirteenth aspect of the present disclosure includes the micro light emitting elements according to the first to eleventh aspects, and includes pixels disposed in an array, a driving circuit substrate including a driving circuit for supplying current to the micro light emitting elements to emit light, and a transparent portion that emits the light emitted from the micro light emitting element to the outside. The transparent portion is disposed on the first electrode and emits the light to the side opposite to the driving circuit substrate, and is surrounded by a partition having a side surface that is tapered to open in the light emitting direction and reflects the light.

According to the above configuration, in the image display device, the transparent portion that emits the light emitted from the micro light emitting element to the outside of the micro light emitting element is surrounded by the partition having the side surface that is tapered to open in the light emitting direction and reflects the light. Accordingly, it is possible to prevent the light from leaking from the transparent portion to the partition and to reflect the light on the side surface of the partition. Therefore, it is possible to reduce the loss of the light emitted to the outside of the transparent portion. As a result, it is possible to form the image display device that exhibits the effect of the first aspect and can reduce the loss of the light emitted to the outside of the image display device.

In the image display device according to a fourteenth aspect of the present disclosure, the side surface of the partition may be covered with a second reflective material that reflects the long-wavelength light or the light in the twelfth or thirteenth aspect.

According to the above configuration, it is possible to more reliably prevent the light from leaking from the wavelength conversion layer or the transparent portion to the partition.

In the image display device according to a fifteenth aspect of the present disclosure, the second reflective material may be electrically connected to the first electrode in the fourteenth aspect.

According to the above configuration, the second reflective material and the first electrode are electrically connected and are disposed on the entire driving circuit substrate. Therefore, it is possible to keep low the wiring resistance between the driving circuit substrate and the micro light emitting element.

In the image display device according to a sixteenth aspect of the present disclosure, the partition may be electrically connected to the first electrode in the twelfth or thirteenth aspect.

According to the above configuration, the partition and the first electrode are electrically connected and are disposed on the entire driving circuit substrate. Therefore, it is possible to keep low the wiring resistance between the driving circuit substrate and the micro light emitting element.

An image display device according to a seventeenth aspect of the present disclosure includes the micro light emitting elements according to the first to eleventh aspects, and includes pixels disposed in an array and a transparent driving circuit substrate including a driving circuit for supplying a current to the micro light emitting element to emit light. The micro light emitting element is disposed with the light emitting surface facing the driving circuit substrate and emits light to the driving circuit substrate side.

According to the above configuration, since the driving circuit substrate is transparent, it is possible to form the image display device that exhibits the effect of the first aspect and can reduce the loss of the light emitted to the outside of the image display device, even in the case of the micro light emitting element disposed with the light emitting surface facing the driving circuit substrate.

The present disclosure is not limited to the embodiments described above, and various modifications are possible within the scope shown in the claims. Embodiments obtained by combining the technical units respectively disclosed in the different embodiments as appropriate are also included in the technical scope of the present disclosure. Further, a new technical feature can be formed by combining the technical units disclosed in respective embodiments.

In the micro light emitting element according to an eighteenth aspect of the present disclosure, the side surface may be curved in the first to fifth aspects.

According to the above configuration, it is possible to improve the light extraction efficiency by adjusting the reflection of the light on the side surface of the body while adjusting the curvature of the curved surface to adjust the area of the light emission layer.

In the micro light emitting element according to a nineteenth aspect of the present disclosure, the transparent insulating film may use a dielectric multilayer film having a DBR function in the third aspect.

According to the above configuration, since the light absorption on the side surface can be reduced, it is possible to further enhance the light extraction effect.

In the micro light emitting element according to a twentieth aspect of the present disclosure, the second conductive layer may include a compound semiconductor multilayer film having the DBR function in the first to eighth aspects.

According to the above configuration, since the reflectance for the visible light in the second conductive layer can be enhanced, it is possible to reduce the light absorption on the bottom surface of the body and to further enhance the light extraction efficiency.

In the micro light emitting element according to a twenty-first aspect of the present disclosure, the first conductive layer may include a compound semiconductor multilayer film having a DBR function in the first to eighth aspects.

According to the above configuration, it is possible to have the high transmissivity for the emission wavelength of the micro light emitting element and have the high reflectance for the light whose wavelength is converted, for example, by stacking the plurality of AlGaN layers and InGaN layers on the compound semiconductor multilayer film. With the disposition of the film having such characteristics on the light emitting surface side, it is possible to prevent the light whose wavelength is converted from being incident on the body, being absorbed by the side surface and the bottom surface of the body, and thus reducing the light output.

In the micro light emitting element according to a twenty-second aspect of the present disclosure, the first reflective material and the second electrode may be disposed separately in the first to eighth aspects.

According to the above configuration, it is possible to use the first reflective material as a part of the wiring line by electrically contacting the first electrode.

The micro light emitting element according to a twenty-third aspect of the present disclosure may have a third electrode connected to the first electrode in the first to eighth aspects.

According to the above configuration, since the P-drive electrode can be provided and connected to the third electrode in the micro light emitting element, it is not requested to provide the region for connecting the first electrode and the P-drive electrode outside the pixel region.

The present disclosure contains subject matter related to that disclosed in Japanese Priority Patent Application JP 2019-132062 filed in the Japan Patent Office on Jul. 17, 2019, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A micro light emitting element comprising:
   a body including a compound semiconductor layer in which a first conductive layer, a light emission layer, and a second conductive layer with a conductive type opposite to a conductive type of the first conductive layer are stacked in order from a light emitting surface side;
   a first electrode including a transparent electrode on the light emitting surface side;
   a second electrode including a metal film on a side opposite to the light emitting surface side; and
   a first reflective material covering a side surface of the body,
   wherein the light emission layer is disposed between a light emitting surface and a middle portion of the body,
   wherein the side surface of the body is tapered at an inclination angle to open in a light emitting direction, and
   wherein a surface of the second electrode and a surface of the first reflective material on the body side are each a reflective surface that reflects visible light.

2. The micro light emitting element according to claim 1, wherein the second electrode and the first reflective material entirely cover the body in plan view.

3. The micro light emitting element according to claim 1, wherein the side surface of the body has at least a first side surface with an inclination angle of 70° or less and a second side surface with an inclination angle of more than 70°, and
   wherein the first side surface is disposed on the light emitting surface side of the second side surface.

4. The micro light emitting element according to claim 1, wherein the side surface of the body has at least a first side surface with an inclination angle of 70° or less and a second side surface with an inclination angle of more than 70°, and
   wherein the second side surface is disposed on the light emitting surface side of the first side surface.

5. The micro light emitting element according to claim 1, wherein the side surface of the body has an inclination angle which is constant.

6. The micro light emitting element according to claim 5, wherein the side surface of the body has an inclination angle of 70° or less.

7. The micro light emitting element according to claim 1, wherein the reflective surface is made of a metal material that reflects visible light.

8. The micro light emitting element according to claim 1, further comprising
   a transparent insulating film between the side surface of the body and the first reflective material.

9. The micro light emitting element according to claim 8, wherein the transparent insulating film has a thickness of 75 nm or more.

10. The micro light emitting element according to claim 9, wherein the transparent insulating film has a thickness of 400 nm or more.

11. The micro light emitting element according to claim 1, wherein the second electrode and the first reflective material are made of an identical material.

12. An image display device comprising:
    a plurality of pixels that each have the micro light emitting element according to claim 1 and are disposed in an array;
    a driving circuit substrate including a driving circuit for supplying a current to the micro light emitting element to emit light; and
    a wavelength conversion layer that absorbs excitation light emitted from the micro light emitting element, converts the absorbed light into long-wavelength light with a wavelength longer than the excitation light, and emits the converted light outside,
    wherein the wavelength conversion layer is disposed on the first electrode and emits the long-wavelength light to a side opposite to the driving circuit substrate, and is surrounded by a partition having a side surface that is tapered to open in the light emitting direction and reflects the long-wavelength light, and
    wherein the partition is in contact with the first electrode.

13. The image display device according to claim 12,
    wherein one of the plurality of pixels has a transparent portion that emits the light emitted from the micro light emitting element outside, and
    wherein the transparent portion
    is disposed on the first electrode and emits the light to the side opposite to the driving circuit substrate, and
    is surrounded by a partition having a side surface that is tapered to open in the light emitting direction and reflects the light.

14. The image display device according to claim 12, wherein the side surface of the partition is covered with a second reflective material that reflects the long-wavelength light or the light.

15. The image display device according to claim 14, wherein the second reflective material is electrically connected to the first electrode.

16. The image display device according to claim 12, wherein an opening portion of the partition is inside an inner edge of an upper end portion of the first reflective material.

17. An image display device comprising:
    a plurality of pixels that each have a micro light emitting element and are disposed in an array;
    a driving circuit substrate including a driving circuit for supplying a current to the micro light emitting element to emit light; and
    a wavelength conversion layer that absorbs excitation light emitted from the micro light emitting element, converts the absorbed light into long-wavelength light with a wavelength longer than the excitation light, and emits the converted light outside,
    wherein the micro light emitting element comprises:
    a body including a compound semiconductor layer in which a first conductive layer, a light emission layer, and a second conductive layer with a conductive type opposite to a conductive type of the first conductive layer are stacked in order from a light emitting surface side;

a first electrode including a transparent electrode on the light emitting surface side;

a second electrode including a metal film on a side opposite to the light emitting surface side; and a first reflective material covering a side surface of the body, wherein the light emission layer is disposed on the light emitting surface side of the body, wherein the side surface of the body is tapered at an inclination angle to open in a light emitting direction, and wherein a surface of the second electrode and a surface of the first reflective material on the body side are each a reflective surface that reflects visible light, wherein the wavelength conversion layer is disposed on the first electrode and emits the long-wavelength light to a side opposite to the driving circuit substrate, and is surrounded by a partition having a side surface that is tapered to open in the light emitting direction and reflects the long-wavelength light, and wherein the partition is electrically connected to the first electrode.

18. An image display device comprising:

a plurality of pixels that each have a micro light emitting element and are disposed in an array; and a driving circuit substrate which is transparent and includes a driving circuit for supplying a current to the micro light emitting element to emit light, wherein the micro light emitting element is disposed with its light emitting surface side facing the driving circuit substrate and emits light to a side of the driving circuit substrate, wherein the micro light emitting element comprises:

a body including a compound semiconductor layer in which a first conductive layer, a light emission layer, and a second conductive layer with a conductive type opposite to a conductive type of the first conductive layer are stacked in order from a light emitting surface side;

a first electrode including a transparent electrode on the light emitting surface side;

a second electrode including a metal film on a side opposite to the light emitting surface side; and a first reflective material covering a side surface of the body, wherein the light emission layer is disposed on the light emitting surface side of the body, wherein the side surface of the body is tapered at an inclination angle to open in a light emitting direction, and wherein a surface of the second electrode and a surface of the first reflective material on the body side are each a reflective surface that reflects visible light.

19. The image display device according to claim 18, wherein the body of the micro light emitting element is entirely covered in plan view with the second electrode of the micro light emitting element, the first reflective material of the micro light emitting element, and a drive electrode of the driving circuit substrate connected to the first electrode of the micro light emitting element.

20. The image display device according to claim 18, wherein the micro light emitting element has a wiring line that is in contact with the light emitting surface side of the first electrode and extends to outside the body.

\* \* \* \* \*